US012581868B2

(12) United States Patent
Samant et al.

(10) Patent No.: US 12,581,868 B2
(45) Date of Patent: Mar. 17, 2026

(54) HALF METALLIC HEUSLER MULTILAYERS WITH PERPENDICULAR MAGNETIC ANISOTROPY

(71) Applicants: International Business Machines Corporation, Armonk, NY (US); Samsung Electronics Co., Ltd., Gyeonggi-do (KR)

(72) Inventors: Mahesh Samant, San Jose, CA (US); Sergey Faleev, Santa Clara, CA (US); Panagiotis Charilaos Filippou, Fremont, CA (US); Chirag Garg, San Jose, CA (US); Jaewoo Jeong, Los Altos, CA (US)

(73) Assignees: International Business Machines Corporation, Armonk, NY (US); Samsung Electronics Co., Ltd., Gyeonggi-Do (KR)

( * ) Notice: Subject to any disclaimer, the term of this patent is extended or adjusted under 35 U.S.C. 154(b) by 371 days.

(21) Appl. No.: 18/220,231

(22) Filed: Jul. 10, 2023

(65) Prior Publication Data

US 2025/0024756 A1     Jan. 16, 2025

(51) Int. Cl.
H10N 50/80 (2023.01)
H01F 10/32 (2006.01)
(Continued)

(52) U.S. Cl.
CPC ......... H10N 50/80 (2023.02); H01F 10/3272 (2013.01); H10B 61/00 (2023.02);
(Continued)

(58) Field of Classification Search
CPC .. H10B 61/00–22; H10B 61/10; H10N 50/80; H10N 50/85; G11C 11/14–1697;
(Continued)

(56) References Cited

U.S. PATENT DOCUMENTS

| | | | |
|---|---|---|---|
| 8,064,244 B2 | 11/2011 | Zhang | |
| 8,988,109 B2 | 3/2015 | Manipatruni | |

(Continued)

FOREIGN PATENT DOCUMENTS

| | | |
|---|---|---|
| CN | 105702853 B | 5/2019 |
| CN | 105977375 B | 8/2019 |

OTHER PUBLICATIONS

Bowen et al., "Nearly total spin polarization in la 2/3 sr1/3MnOs from tunneling experiments" Submitted: Jul. 5, 2002 • Accepted: Nov. 11, 2002 • Published Online: Jan. 6, 2003. p. 4.
(Continued)

*Primary Examiner* — Scott B Geyer
(74) *Attorney, Agent, or Firm* — Kelsey M. Skodje; Otterstedt & Kammer PLLC

(57) ABSTRACT

A magnetoresistive random-access memory cell includes a templating layer, including a binary alloy having an alternating layer lattice structure, and a half metallic Heusler multilayer structure including a plurality of layers of two different Heusler compounds, at least one of which is half metallic. The half metallic Heusler multilayer structure is located outward of the templating layer and exhibits perpendicular magnetic anisotropy (PMA). A tunnel barrier is outward of the half metallic Heusler multilayer structure, and a magnetic layer is outward of the tunnel barrier.

21 Claims, 22 Drawing Sheets

(51) Int. Cl.

| | |
|---|---|
| *H10B 61/00* | (2023.01) |
| *H10N 50/01* | (2023.01) |
| *H10N 50/20* | (2023.01) |
| *H10N 50/85* | (2023.01) |

(52) U.S. Cl.
CPC ............. *H10N 50/01* (2023.02); *H10N 50/20* (2023.02); *H10N 50/85* (2023.02)

(58) Field of Classification Search
CPC ............ G11C 11/5607; G11C 14/0036; G11C 14/0045; G11C 14/0081; G11C 19/02–10; G11C 19/14; G11C 2211/5615–5616
See application file for complete search history.

(56) References Cited

U.S. PATENT DOCUMENTS

| | | | | |
|---|---|---|---|---|
| 9,634,241 | B2 | 4/2017 | Butler | |
| 9,643,385 | B1 | 5/2017 | Butler | |
| 10,170,696 | B1* | 1/2019 | Jeong | G11C 11/161 |
| 10,546,997 | B2 | 1/2020 | Wang | |
| 10,867,625 | B1* | 12/2020 | Freitag | G11B 5/235 |
| 10,916,581 | B2 | 2/2021 | Worledge | |
| 10,937,953 | B2 | 3/2021 | Jeong | |
| 2002/0018919 | A1* | 2/2002 | Saito | H01F 10/12 |
| 2015/0129996 | A1* | 5/2015 | Tang | H10N 50/01 |
| | | | | 257/427 |
| 2015/0162378 | A1* | 6/2015 | Carey | H10N 50/10 |
| | | | | 257/421 |
| 2016/0043301 | A1* | 2/2016 | Butler | H10N 50/10 |
| | | | | 257/427 |
| 2018/0269387 | A1* | 9/2018 | Iwata | H10N 50/01 |
| 2018/0366172 | A1* | 12/2018 | Wang | H10N 50/10 |
| 2019/0189913 | A1* | 6/2019 | Doyle | G11C 11/161 |
| 2019/0305040 | A1* | 10/2019 | Jeong | H10B 61/00 |
| 2020/0243755 | A1* | 7/2020 | Jeong | H10N 50/80 |
| 2021/0028354 | A1* | 1/2021 | Sasaki | H10N 50/80 |
| 2021/0159402 | A1* | 5/2021 | Ikhtiar | H10N 50/10 |
| 2022/0013714 | A1 | 1/2022 | Park | |
| 2022/0130901 | A1* | 4/2022 | Sonobe | H10B 61/00 |
| 2022/0165469 | A1* | 5/2022 | Jeong | H10N 50/10 |
| 2022/0165939 | A1* | 5/2022 | Jeong | H10N 50/85 |
| 2022/0223783 | A1* | 7/2022 | Jeong | H10B 61/00 |
| 2022/0262555 | A1* | 8/2022 | Jeong | H01F 10/324 |
| 2023/0116592 | A1* | 4/2023 | Samant | H01F 10/3286 |
| | | | | 257/213 |
| 2023/0225220 | A1* | 7/2023 | Kim | H10N 50/01 |
| | | | | 365/158 |
| 2023/0317129 | A1* | 10/2023 | Faleev | H10N 50/85 |
| | | | | 365/158 |
| 2023/0413681 | A1* | 12/2023 | Filippou | G11C 11/161 |
| 2024/0155950 | A1* | 5/2024 | Filippou | H10N 50/10 |
| 2024/0196755 | A1* | 6/2024 | Gottwald | H01F 10/3272 |
| 2024/0237543 | A1* | 7/2024 | Apalkov | H01F 10/3286 |
| 2024/0244982 | A1* | 7/2024 | Hu | H10N 50/10 |
| 2024/0334837 | A1* | 10/2024 | Gottwald | H10B 61/00 |
| 2024/0349615 | A1* | 10/2024 | Park | H10B 61/00 |
| 2024/0349619 | A1* | 10/2024 | Jeong | H10N 50/85 |
| 2024/0349622 | A1* | 10/2024 | Jeong | H10N 50/10 |
| 2024/0357942 | A1* | 10/2024 | Reznicek | H10N 50/01 |

OTHER PUBLICATIONS

Basha et al., "Interface alloying of ultra-thin sputter-deposited Co2MnSi films as a source of perpendicular magnetic anisotropy" Elsevier B.V. May 26, 2019. pp. 13.

Munira et al., "Achieving perpendicular anisotropy in half-metallic Heusler alloys for spin device applications" J. Appl. Phys. 115, 17B731 (2014). pp. 4.

Sakuraba et al., "Giant tunneling magnetoresistance in Co2MnSi/Al—O/Co2MnSi magnetic tunnel junctions" Applied Physics Letters 88, 192508, 2006. pp. 3.

Shinohara et al., "Methods to induce perpendicular magnetic anisotropy in full-Heusler Co2FeSi thin layers in a magnetic tunnel junction structure" AIP Advances 8, 055923 (2018); pp. 6.

Tezuka et al., "Improved tunnel magnetoresistance of magnetic tunnel junctions with Heusler Co2FeAl0.5Si0.5 electrodes fabricated by molecular beam epitaxy". Appl. Phys. Lett.Apr. 20, 2009. pp. 3.

Tsunegi et., "Large tunnel magnetoresistance in magnetic tunnel junctions using a Co2MnSi Heusler alloy electrode and a MgO barrier" Applied Physics Letters 93, 112506, 2008, pp. 3.

Wang et al., "Temperature dependence of tunneling magnetoresistance in epitaxial magnetic tunnel junctions using a Co2FeAl Heusler alloy electrode" Physical Review B 82, 092402, 2010. pp. 4.

Wen et al,. "Magnetic Tunnel Junctions with Perpendicular Anisotropy Using a Co2FeAl Full-Heusler Alloy" 2012 Appl. Phys. Express 5 063003. pp. 4.

Wu et al., "Perpendicular magnetic anisotropy and magnetization dynamics in oxidized CoFeAl films" Scientific Reports 2015. pp. 9.

Y. Wu et al., "Perpendicular Magnetic Anisotropy in Co-Based Full Heusler Alloy Thin Films" Spin vol. 5, No. 4 (2015) World Scientific Publishing Company 1540012 (12 pages).

Peter Mell and Timothy Grance, The NIST Definition of Cloud Computing, NIST Special Publication 800-145, cover, pp. i-iii, 1-3, Sep. 2011.

Wen et al., "Perpendicular magnetization of Co2FeAlfull-Heusler alloy films induced by MgO interface", Appl. Phys. Lett. 98, Jun. 16, 2011.

\* cited by examiner

301 — ◉ Ge Atom (Main Group Atom)

303 — ○ Mn Atom (X Position or Tetrahedrally Coordinated by Z)

305 — ● Mn Atom (Y Position or Octahedrally Coordinated by Z)

| Heusler/Heusler | $a$ (Å) | $c/a$ | $mom$ ($\mu_B$) | $mom/at$ ($\mu_B$) | $E_{min}$ (eV) | $E_{max}$ (eV) | $E_g$ (eV) | $K_{sh}$ (meV) | $K_v$ (MJ/m^3) | $SP$ | $PMA$ | $HM$ |
|---|---|---|---|---|---|---|---|---|---|---|---|---|
| Mn3Ge | 3.730 | 0.950 | 1.01 | 0.25 | | | | 0.01 | 2.48 | | | |
| **** Heusler/Mn3Ge ******************************** | | | | | | | | | | | | |
| 1x[Mn2CoSi] / 1x[Mn2MnGe] | 4.004 | 1.416 | 4.00 | 0.50 | 0.05 | 0.25 | 0.20 | 0.06 | -0.23 | 0.993 | no | no |
| 2x[Mn2CoSi] / 1x[Mn2MnGe] | 3.981 | 2.136 | 7.00 | 0.58 | 0.01 | 0.24 | 0.23 | 0.12 | 0.01 | 0.998 | yes | no |
| 1x[Mn2CoSi] / 2x[Mn2MnGe] | 3.915 | 2.126 | 5.01 | 0.42 | 0.10 | 0.32 | 0.22 | 0.07 | -0.07 | 0.963 | no | no |
| 2x[Mn2CoSi] / 2x[Mn2MnGe] | 3.997 | 2.849 | 8.00 | 0.50 | 0.01 | 0.25 | 0.24 | 0.12 | 0.11 | 0.997 | yes | no |
| 1x[Mn2CuSi] / 1x[Mn2MnGe] | 4.032 | 1.428 | 3.30 | 0.41 | | | | 0.04 | -0.31 | 0.514 | no | no |
| 2x[Mn2CuSi] / 1x[Mn2MnGe] | 4.116 | 2.170 | 3.45 | 0.29 | | | | 0.03 | 0.35 | 0.466 | no | no |
| 1x[Mn2CuSi] / 2x[Mn2MnGe] | 4.119 | 2.099 | 3.92 | 0.33 | | | | 0.04 | 0.38 | 0.233 | yes | no |
| 2x[Mn2CuSi] / 2x[Mn2MnGe] | 3.990 | 2.965 | 4.31 | 0.27 | | | | 0.03 | 0.61 | 0.774 | yes | no |
| 1x[Mn2CoGe] / 1x[Mn2MnGe] | 4.046 | 1.412 | 4.00 | 0.50 | 0.05 | 0.19 | 0.14 | 0.06 | -0.25 | 0.994 | no | no |
| 2x[Mn2CoGe] / 1x[Mn2MnGe] | 4.037 | 2.130 | 7.00 | 0.58 | 0.02 | 0.19 | 0.17 | 0.12 | -0.07 | 0.993 | no | no |
| 1x[Mn2CoGe] / 2x[Mn2MnGe] | 4.048 | 2.120 | 5.00 | 0.42 | 0.09 | 0.28 | 0.19 | 0.06 | -0.07 | 0.963 | no | no |
| 2x[Mn2CoGe] / 2x[Mn2MnGe] | 4.039 | 2.839 | 8.00 | 0.50 | 0.04 | 0.21 | 0.17 | 0.12 | 0.10 | 0.994 | yes | no |
| 1x[Mn2MnAl] / 1x[Mn2MnGe] | 4.077 | 1.405 | 1.00 | 0.13 | 0.07 | 0.50 | 0.43 | 0.00 | 0.08 | 0.979 | yes | no |
| 2x[Mn2MnAl] / 1x[Mn2MnGe] | 4.075 | 2.114 | 1.00 | 0.08 | 0.04 | 0.44 | 0.40 | 0.00 | -0.07 | 0.994 | no | no |
| 1x[Mn2MnAl] / 2x[Mn2MnGe] | 4.062 | 2.125 | 2.00 | 0.17 | 0.07 | 0.51 | 0.44 | 0.01 | 0.06 | 0.972 | yes | no |
| 2x[Mn2MnAl] / 2x[Mn2MnGe] | 4.061 | 2.842 | 2.00 | 0.13 | 0.06 | 0.51 | 0.45 | 0.01 | 0.16 | 0.983 | yes | no |

FIG. 3A

| Heusler/Heusler | a (Å) | c/a | mom (μB) | mom/at (μB) | E_min (eV) | E_max (eV) | E_g (eV) | K_sh (meV) | K_v (MJ/m^3) | SP | PMA | HM | |
|---|---|---|---|---|---|---|---|---|---|---|---|---|---|
| **** Heusler/Mn3Ge ********** | ********** | | | | | | | | | | | | |
| 1x[Co2MnSi] / 1x[Mn2MnGe] | 4.000 | 1.421 | 6.00 | 0.75 | -0.06 | 0.29 | 0.35 | 0.13 | 0.51 | 1.000 | yes | yes | Most Promising |
| 2x[Co2MnSi] / 1x[Mn2MnGe] | 3.995 | 2.120 | 11.00 | 0.92 | -0.12 | 0.30 | 0.42 | 0.30 | -0.04 | 1.000 | no | yes | |
| 1x[Co2MnSi] / 2x[Mn2MnGe] | 4.004 | 2.147 | 7.00 | 0.58 | -0.02 | 0.25 | 0.27 | 0.12 | 0.36 | 1.000 | yes | yes | Most Promising |
| 2x[Co2MnSi] / 2x[Mn2MnGe] | 4.001 | 2.846 | 12.00 | 0.75 | -0.06 | 0.28 | 0.34 | 0.27 | 0.02 | 1.000 | yes | yes | |
| 1x[Mn2CoAs] / 1x[Mn2MnGe] | 4.019 | 1.434 | 5.00 | 0.63 | 0.04 | 0.28 | 0.24 | 0.09 | -0.16 | 0.967 | no | no | |
| 2x[Mn2CoAs] / 1x[Mn2MnGe] | 4.036 | 2.129 | 9.00 | 0.75 | -0.03 | 0.30 | 0.33 | 0.19 | -0.29 | 1.000 | no | yes | |
| 1x[Mn2CoAs] / 2x[Mn2MnGe] | 4.029 | 2.139 | 6.00 | 0.50 | 0.06 | 0.28 | 0.22 | 0.09 | 0.14 | 0.991 | yes | no | |
| 2x[Mn2CoAs] / 2x[Mn2MnGe] | 4.034 | 2.843 | 10.00 | 0.63 | 0.01 | 0.28 | 0.27 | 0.18 | -0.11 | 1.000 | no | no | |
| 1x[Co2MnGe] / 1x[Mn2MnGe] | 4.042 | 1.420 | 6.00 | 0.75 | -0.01 | 0.29 | 0.30 | 0.13 | 0.36 | 1.000 | yes | yes | Most Promising |
| 2x[Co2MnGe] / 1x[Mn2MnGe] | 4.051 | 2.117 | 11.00 | 0.92 | -0.01 | 0.33 | 0.34 | 0.29 | 0.07 | 1.000 | yes | yes | |
| 1x[Co2MnGe] / 2x[Mn2MnGe] | 4.031 | 2.147 | 7.00 | 0.58 | -0.01 | 0.27 | 0.28 | 0.12 | 0.38 | 1.000 | yes | yes | Most Promising |
| 2x[Co2MnGe] / 2x[Mn2MnGe] | 4.042 | 2.841 | 12.00 | 0.75 | -0.01 | 0.31 | 0.32 | 0.26 | 0.03 | 1.000 | yes | yes | |
| 1x[Fe2MnSi] / 1x[Mn2MnGe] | 3.985 | 1.412 | 4.00 | 0.50 | 0.10 | 0.43 | 0.33 | 0.06 | -0.07 | 0.912 | no | no | |
| 2x[Fe2MnSi] / 1x[Mn2MnGe] | 3.968 | 2.131 | 7.00 | 0.58 | 0.02 | 0.39 | 0.37 | 0.12 | 0.07 | 0.997 | yes | no | |
| 1x[Fe2MnSi] / 2x[Mn2MnGe] | 4.005 | 2.135 | 5.04 | 0.42 | 0.16 | 0.56 | 0.40 | 0.06 | 0.00 | 0.911 | no | no | |
| 2x[Fe2MnSi] / 2x[Mn2MnGe] | 3.983 | 2.849 | 8.00 | 0.50 | 0.70 | 0.43 | 0.36 | 0.12 | 0.16 | 0.958 | yes | no | |
| 1x[Mn2FeAs] / 1x[Mn2MnGe] | 4.033 | 1.412 | 4.00 | 0.50 | 0.10 | 0.38 | 0.28 | 0.06 | -0.22 | 0.838 | no | no | |
| 2x[Mn2FeAs] / 1x[Mn2MnGe] | 4.026 | 2.127 | 7.00 | 0.58 | 0.05 | 0.34 | 0.29 | 0.12 | -0.22 | 0.984 | no | no | |
| 1x[Mn2FeAs] / 2x[Mn2MnGe] | 4.038 | 2.121 | 5.04 | 0.42 | 0.17 | 0.54 | 0.37 | 0.06 | -0.07 | 0.925 | no | no | |
| 2x[Mn2FeAs] / 2x[Mn2MnGe] | 4.028 | 2.838 | 8.00 | 0.50 | 0.08 | 0.38 | 0.30 | 0.12 | 0.12 | 0.957 | yes | no | |

FIG. 3B

Most Promising

| Heusler/Heusler | a (Å) | c/a | mom (μB) | mom/at (μB) | $E_{min}$ (eV) | $E_{max}$ (eV) | $E_g$ (eV) | $K_{sh}$ (meV) | $K_i$ (MJ/m^3) | SP | PMA | HM |
|---|---|---|---|---|---|---|---|---|---|---|---|---|
| **** Heusler/Mn3Al ****************** | | | | | | | | | | | | |
| 1x[Co2MnSi] / 1x[Mn2MnAl] | 4.007 | 1.413 | 5.00 | 0.63 | -0.09 | 0.37 | 0.46 | 0.09 | -0.18 | 1.000 | no | yes |
| 2x[Co2MnSi] / 1x[Mn2MnAl] | 3.992 | 2.126 | 10.00 | 0.83 | -0.09 | 0.34 | 0.43 | 0.25 | 0.06 | 1.000 | yes | yes |
| 1x[Co2MnSi] / 2x[Mn2MnAl] | 4.025 | 2.126 | 5.00 | 0.42 | -0.05 | 0.37 | 0.42 | 0.06 | -0.23 | 1.000 | no | yes |
| 2x[Co2MnSi] / 2x[Mn2MnAl] | 4.009 | 2.842 | 10.00 | 0.63 | -0.07 | 0.32 | 0.39 | 0.18 | -0.23 | 1.000 | no | yes |
| | | | | | | | | | | | | |
| 1x[Mn2CoSi] / 1x[Mn2MnAl] | 4.013 | 1.409 | 3.00 | 0.38 | -0.01 | 0.33 | 0.34 | 0.03 | 0.03 | 1.000 | yes | yes |
| 2x[Mn2CoSi] / 1x[Mn2MnAl] | 3.976 | 2.135 | 6.00 | 0.50 | -0.01 | 0.27 | 0.28 | 0.09 | 0.19 | 1.000 | yes | yes |
| 1x[Mn2CoSi] / 2x[Mn2MnAl] | 4.028 | 2.122 | 3.00 | 0.25 | -0.03 | 0.30 | 0.33 | 0.02 | 0.12 | 1.000 | yes | yes |
| 2x[Mn2CoSi] / 2x[Mn2MnAl] | 3.992 | 2.862 | 6.00 | 0.38 | -0.02 | 0.30 | 0.32 | 0.07 | 0.24 | 1.000 | yes | yes |
| | | | | | | | | | | | | |
| 1x[Mn2CoAl] / 1x[Mn2MnAl] | 4.052 | 1.420 | 2.00 | 0.25 | -0.08 | 0.25 | 0.32 | 0.01 | 0.47 | 1.000 | yes | yes |
| 2x[Mn2CoAl] / 1x[Mn2MnAl] | 4.050 | 2.124 | 4.00 | 0.33 | -0.10 | 0.29 | 0.39 | 0.04 | -0.07 | 1.000 | no | yes |
| 1x[Mn2CoAl] / 2x[Mn2MnAl] | 4.059 | 2.125 | 2.00 | 0.17 | -0.07 | 0.33 | 0.40 | 0.01 | 0.11 | 1.000 | yes | yes |
| 2x[Mn2CoAl] / 2x[Mn2MnAl] | 4.050 | 2.839 | 4.00 | 0.25 | -0.07 | 0.32 | 0.39 | 0.03 | 0.04 | 1.000 | yes | yes |
| | | | | | | | | | | | | |
| 1x[Mn2FeSb] / 1x[Mn2MnAl] | 4.156 | 1.400 | 3.01 | 0.38 | 0.12 | 0.38 | 0.26 | 0.03 | 0.27 | 0.967 | yes | no |
| 2x[Mn2FeSb] / 1x[Mn2MnAl] | 4.169 | 2.113 | 6.00 | 0.50 | 0.02 | 0.38 | 0.36 | 0.08 | 0.20 | 0.996 | yes | no |
| 1x[Mn2FeSb] / 2x[Mn2MnAl] | 4.146 | 2.076 | 3.01 | 0.25 | 0.09 | 0.24 | 0.15 | 0.02 | 0.05 | 0.979 | yes | no |
| 2x[Mn2FeSb] / 2x[Mn2MnAl] | 4.159 | 2.789 | 6.00 | 0.38 | 0.04 | 0.27 | 0.23 | 0.06 | -0.10 | 0.985 | no | no |
| | | | | | | | | | | | | |
| 1x[Mn2CuSi] / 1x[Mn2MnAl] | 4.068 | 1.391 | 2.47 | 0.31 | | | | 0.02 | 0.29 | 0.385 | yes | no |
| 2x[Mn2CuSi] / 1x[Mn2MnAl] | 4.061 | 2.088 | 3.39 | 0.28 | | | | 0.03 | 0.33 | 0.169 | yes | no |
| 1x[Mn2CuSi] / 2x[Mn2MnAl] | 4.084 | 2.076 | 2.53 | 0.21 | | | | 0.02 | 0.15 | 0.596 | yes | no |
| 2x[Mn2CuSi] / 2x[Mn2MnAl] | 4.060 | 2.812 | 2.55 | 0.16 | | | | 0.01 | 0.52 | 0.489 | yes | no |

FIG. 3C

| Heusler/Heusler | a (Å) | c/a | mom (μB) | mom/at (μB) | E_min (eV) | E_max (eV) | E_g (eV) | K_sh (meV) | K_v (MJ/m^3) | SP | PMA | HM |
|---|---|---|---|---|---|---|---|---|---|---|---|---|
| **** Heusler/Mn3Al *********************************** | | | | | | | | | | | | |
| 1x[Mn2CoGe] / 1x[Mn2MnAl] | 4.066 | 1.399 | 3.00 | 0.38 | 0.04 | 0.28 | 0.24 | 0.03 | -0.16 | 0.996 | no | no |
| 2x[Mn2CoGe] / 1x[Mn2MnAl] | 4.041 | 2.124 | 6.00 | 0.50 | 0.01 | 0.19 | 0.18 | 0.09 | 0.14 | 1.000 | yes | no |
| 1x[Mn2CoGe] / 2x[Mn2MnAl] | 4.090 | 2.091 | 3.00 | 0.25 | 0.01 | 0.25 | 0.24 | 0.02 | -0.02 | 0.999 | no | no |
| 2x[Mn2CoGe] / 2x[Mn2MnAl] | 4.052 | 2.825 | 6.00 | 0.38 | 0.01 | 0.19 | 0.18 | 0.06 | 0.10 | 1.000 | yes | no |
| | -126.52 | | | | | | | | | | | |
| 1x[Mn2CoAs] / 1x[Mn2MnAl] | 4.042 | 1.412 | 4.00 | 0.50 | 0.01 | 0.26 | 0.25 | 0.06 | -0.32 | 1.000 | no | no |
| 2x[Mn2CoAs] / 1x[Mn2MnAl] | 4.035 | 2.129 | 8.00 | 0.67 | -0.04 | 0.25 | 0.29 | 0.15 | -0.17 | 1.000 | no | yes |
| 1x[Mn2CoAs] / 2x[Mn2MnAl] | 4.053 | 2.114 | 4.00 | 0.33 | 0.01 | 0.29 | 0.28 | 0.04 | -0.11 | 0.999 | no | no |
| 2x[Mn2CoAs] / 2x[Mn2MnAl] | 4.045 | 2.829 | 8.00 | 0.50 | -0.05 | 0.21 | 0.26 | 0.12 | 0.08 | 1.000 | yes | yes |
| 1x[Mn2FeAs] / 1x[Mn2MnAl] | 4.048 | 1.405 | 3.01 | 0.38 | 0.12 | 0.48 | 0.36 | 0.03 | -0.06 | 0.956 | no | no |
| 2x[Mn2FeAs] / 1x[Mn2MnAl] | 4.025 | 2.126 | 6.00 | 0.50 | 0.05 | 0.38 | 0.33 | 0.09 | 0.11 | 0.976 | yes | no |
| 1x[Mn2FeAs] / 2x[Mn2MnAl] | 4.058 | 2.108 | 3.00 | 0.25 | 0.06 | 0.48 | 0.42 | 0.02 | 0.03 | 0.992 | yes | no |
| 2x[Mn2FeAs] / 2x[Mn2MnAl] | 4.035 | 2.836 | 6.00 | 0.38 | 0.05 | 0.45 | 0.40 | 0.07 | 0.12 | 0.992 | yes | no |
| 1x[Mn2MnAs] / 1x[Mn2MnAl] | 4.050 | 1.413 | 2.00 | 0.25 | 0.05 | 0.51 | 0.46 | 0.01 | -0.14 | 0.991 | no | no |
| 2x[Mn2MnAs] / 1x[Mn2MnAl] | 4.042 | 2.116 | 4.03 | 0.34 | 0.11 | 0.46 | 0.35 | 0.04 | -0.26 | 0.951 | no | no |
| 1x[Mn2MnAs] / 2x[Mn2MnAl] | 4.059 | 2.117 | 2.00 | 0.17 | 0.00 | 0.48 | 0.48 | 0.01 | 0.16 | 1.000 | yes | no |
| 2x[Mn2MnAs] / 2x[Mn2MnAl] | 4.050 | 2.823 | 4.01 | 0.25 | 0.07 | 0.42 | 0.42 | 0.03 | -0.05 | 0.992 | no | no |

FIG. 3D

Most Promising

| Heusler/Heusler | a (Å) | c/a | mom (μB) | mom/at (μB) | Emin (eV) | Emax (eV) | Eg (eV) | Kxh (meV) | Kv (MJ/m^3) | SP | PMA | HM |
|---|---|---|---|---|---|---|---|---|---|---|---|---|
| **** Heusler/Mn3Al **** | ******* | ******* | ******* | | | | | | | | | |
| 1x[Co2CrAl] / 1x[Mn2MnAl] | 4.056 | 1.393 | 3.00 | 0.38 | -0.11 | 0.09 | 0.20 | 0.03 | -0.04 | 1.000 | no | yes |
| 2x[Co2CrAl] / 1x[Mn2MnAl] | 4.060 | 2.089 | 6.00 | 0.50 | -0.12 | 0.14 | 0.26 | 0.09 | 0.00 | 1.000 | yes | yes |
| 1x[Co2CrAl] / 2x[Mn2MnAl] | 4.049 | 2.115 | 3.00 | 0.25 | -0.02 | 0.19 | 0.21 | 0.02 | -0.14 | 1.000 | no | yes |
| 2x[Co2CrAl] / 2x[Mn2MnAl] | 4.050 | 2.802 | 6.00 | 0.38 | -0.06 | 0.26 | 0.32 | 0.07 | 0.04 | 1.000 | yes | yes |
| 1x[Co2MnSb] / 1x[Mn2MnAl] | 4.132 | 1.424 | 6.00 | 0.75 | -0.09 | 0.29 | 0.38 | 0.12 | 0.61 | 1.000 | yes | yes |
| 2x[Co2MnSb] / 1x[Mn2MnAl] | 4.164 | 2.138 | 12.00 | 1.00 | -0.16 | 0.17 | 0.33 | 0.31 | 0.17 | 1.000 | yes | yes |
| 1x[Co2MnSb] / 2x[Mn2MnAl] | 4.118 | 2.117 | 6.00 | 0.50 | -0.16 | 0.26 | 0.42 | 0.08 | 0.11 | 1.000 | yes | yes |
| 2x[Co2MnSb] / 2x[Mn2MnAl] | 4.150 | 2.830 | 12.00 | 0.75 | -0.19 | 0.17 | 0.36 | 0.24 | 0.10 | 1.000 | yes | yes |
| 1x[Co2MnGe] / 1x[Mn2MnAl] | 4.053 | 1.412 | 5.00 | 0.63 | -0.06 | 0.31 | 0.37 | 0.09 | 0.07 | 1.000 | yes | yes |
| 2x[Co2MnGe] / 1x[Mn2MnAl] | 4.053 | 2.115 | 10.00 | 0.83 | -0.03 | 0.35 | 0.38 | 0.24 | 0.03 | 1.000 | yes | yes |
| 1x[Co2MnGe] / 2x[Mn2MnAl] | 4.055 | 2.116 | 5.00 | 0.42 | -0.03 | 0.38 | 0.41 | 0.06 | -0.25 | 1.000 | no | yes |
| 2x[Co2MnGe] / 2x[Mn2MnAl] | 4.063 | 2.815 | 10.00 | 0.63 | -0.02 | 0.34 | 0.36 | 0.18 | -0.24 | 1.000 | no | yes |
| 1x[Fe2MnSi] / 1x[Mn2MnAl] | 3.986 | 1.426 | 3.03 | 0.38 | 0.14 | 0.43 | 0.29 | 0.03 | -0.33 | 0.858 | no | no |
| 2x[Fe2MnSi] / 1x[Mn2MnAl] | 3.963 | 2.139 | 6.00 | 0.50 | 0.01 | 0.36 | 0.37 | 0.09 | 0.05 | 0.991 | yes | no |
| 1x[Fe2MnSi] / 2x[Mn2MnAl] | 4.005 | 2.146 | 3.03 | 0.25 | 0.09 | 0.43 | 0.34 | 0.02 | 0.00 | 0.952 | no | no |
| 2x[Fe2MnSi] / 2x[Mn2MnAl] | 3.980 | 2.866 | 6.00 | 0.38 | 0.04 | 0.42 | 0.38 | 0.07 | 0.08 | 0.991 | yes | no |

FIG. 3E

| Heusler/Heusler | $a$ (Å) | $c/a$ | mom ($\mu_B$) | mom/at ($\mu_B$) | $E_{min}$ (eV) | $E_{max}$ (eV) | $E_g$ (eV) | $K_{sh}$ (meV) | $K_v$ (MJ/m^3) | SP | PMA | HM |
|---|---|---|---|---|---|---|---|---|---|---|---|---|
| **** Heusler/Mn2CoSi ********* | | | | | | | | | | | | |
| 1x[Mn2CoAl] / 1x[Mn2CoSi] | 3.990 | 1.421 | 5.00 | 0.63 | -0.10 | 0.25 | 0.35 | 0.09 | 0.03 | 1.000 | yes | yes |
| 2x[Mn2CoAl] / 1x[Mn2CoSi] | 4.007 | 2.129 | 7.00 | 0.58 | -0.20 | 0.22 | 0.42 | 0.12 | -0.21 | 1.000 | no | yes |
| 1x[Mn2CoAl] / 2x[Mn2CoSi] | 3.978 | 2.132 | 8.00 | 0.67 | -0.26 | 0.21 | 0.47 | 0.16 | -0.14 | 1.000 | no | yes |
| 2x[Mn2CoAl] / 2x[Mn2CoSi] | 3.991 | 2.844 | 10.00 | 0.63 | -0.25 | 0.18 | 0.43 | 0.19 | -0.06 | 1.000 | no | yes |
| 1x[Mn2CuSi] / 1x[Mn2CoSi] | 4.041 | 1.376 | 4.66 | 0.58 | | | | 0.08 | -0.02 | 0.200 | no | no |
| 2x[Mn2CuSi] / 1x[Mn2CoSi] | 3.973 | 2.201 | 5.14 | 0.43 | | | | 0.06 | 0.04 | 0.854 | yes | no |
| 1x[Mn2CuSi] / 2x[Mn2CoSi] | 3.984 | 2.129 | 7.24 | 0.60 | | | | 0.13 | 0.02 | 0.820 | yes | no |
| 2x[Mn2CuSi] / 2x[Mn2CoSi] | 3.970 | 2.907 | 8.15 | 0.51 | | | | 0.12 | 0.08 | 0.905 | yes | no |
| 1x[Co2MnSb] / 1x[Mn2CoSi] | 4.089 | 1.432 | 9.00 | 1.13 | -0.20 | 0.14 | 0.34 | 0.28 | 0.17 | 1.000 | yes | yes |
| 2x[Co2MnSb] / 1x[Mn2CoSi] | 4.130 | 2.161 | 15.00 | 1.25 | -0.24 | 0.04 | 0.28 | 0.50 | -0.18 | 1.000 | no | yes |
| 1x[Co2MnSb] / 2x[Mn2CoSi] | 4.009 | 2.200 | 11.34 | 0.95 | | | | 0.31 | 0.04 | 0.361 | yes | no |
| 2x[Co2MnSb] / 2x[Mn2CoSi] | 3.979 | 3.102 | 14.87 | 0.93 | | | | 0.38 | -0.08 | 0.574 | no | no |

FIG. 3F

| Heusler/Heusler | $a$ (Å) | $c/a$ | $mom$ ($\mu_B$) | $mom/at$ ($\mu_B$) | $E_{min}$ (eV) | $E_{max}$ (eV) | $E_g$ (eV) | $K_{sh}$ (meV) | $K_v$ (MJ/m^3) | $SP$ | $PMA$ | $HM$ |
|---|---|---|---|---|---|---|---|---|---|---|---|---|
| **** Heusler/Mn2CoAl *********** | | | | | | | | | | | | |
| 1x[Mn2CuSi] / 1x[Mn2CoAl] | 4.042 | 1.417 | 3.50 | 0.44 | | | | 0.04 | 0.30 | 0.310 | yes | no |
| 2x[Mn2CuSi] / 1x[Mn2CoAl] | 3.985 | 2.220 | 4.10 | 0.34 | | | | 0.04 | 0.25 | 0.593 | yes | no |
| 1x[Mn2CuSi] / 2x[Mn2CoAl] | 4.021 | 2.157 | 5.40 | 0.45 | | | | 0.07 | 0.06 | 0.600 | yes | no |
| 2x[Mn2CuSi] / 2x[Mn2CoAl] | 4.018 | 2.887 | 6.10 | 0.38 | | | | 0.07 | 0.23 | 0.714 | yes | no |
| | | | | | | | | | | | | |
| 1x[Co2CrAl] / 1x[Mn2CoAl] | 4.020 | 1.428 | 5.00 | 0.63 | 0.02 | 0.35 | 0.33 | 0.09 | 0.21 | 0.999 | yes | no |
| 2x[Co2CrAl] / 1x[Mn2CoAl] | 4.029 | 2.127 | 8.00 | 0.67 | -0.02 | 0.32 | 0.34 | 0.16 | 0.22 | 1.000 | yes | yes |
| 1x[Co2CrAl] / 2x[Mn2CoAl] | 4.026 | 2.136 | 7.00 | 0.58 | -0.02 | 0.30 | 0.32 | 0.12 | 0.11 | 1.000 | yes | yes |
| 2x[Co2CrAl] / 2x[Mn2CoAl] | 4.035 | 2.828 | 10.00 | 0.63 | -0.06 | 0.29 | 0.35 | 0.18 | 0.17 | 1.000 | yes | yes |
| | | | | | | | | | | | | |
| 1x[Co2CrGe] / 1x[Mn2CoAl] | 4.028 | 1.428 | 6.00 | 0.75 | -0.06 | 0.22 | 0.28 | 0.13 | 0.07 | 1.000 | yes | yes |
| 2x[Co2CrGe] / 1x[Mn2CoAl] | 4.043 | 2.127 | 10.00 | 0.83 | -0.10 | 0.20 | 0.30 | 0.24 | -0.14 | 1.000 | no | yes |
| 1x[Co2CrGe] / 2x[Mn2CoAl] | 4.028 | 2.138 | 8.00 | 0.67 | -0.05 | 0.27 | 0.32 | 0.15 | 0.09 | 1.000 | yes | yes |
| 2x[Co2CrGe] / 2x[Mn2CoAl] | 4.042 | 2.834 | 12.00 | 0.75 | -0.08 | 0.26 | 0.34 | 0.26 | -0.12 | 1.000 | no | yes |
| | | | | | | | | | | | | |
| 1x[Co2CrSi] / 1x[Mn2CoAl] | 3.981 | 1.438 | 6.00 | 0.75 | -0.15 | 0.28 | 0.43 | 0.13 | 0.12 | 1.000 | yes | yes |
| 2x[Co2CrSi] / 1x[Mn2CoAl] | 3.985 | 2.140 | 10.00 | 0.83 | -0.25 | 0.25 | 0.50 | 0.25 | -0.06 | 1.000 | no | yes |
| 1x[Co2CrSi] / 2x[Mn2CoAl] | 3.998 | 2.147 | 8.00 | 0.67 | -0.11 | 0.29 | 0.40 | 0.16 | 0.10 | 1.000 | yes | yes |
| 2x[Co2CrSi] / 2x[Mn2CoAl] | 3.997 | 2.841 | 12.00 | 0.75 | -0.19 | 0.23 | 0.42 | 0.27 | -0.12 | 1.000 | no | yes |
| | | | | | | | | | | | | |
| 1x[Fe2MnSi] / 1x[Mn2CoAl] | 3.958 | 1.445 | 5.00 | 0.63 | 0.06 | 0.31 | 0.25 | 0.09 | -0.10 | 0.983 | no | no |
| 2x[Fe2MnSi] / 1x[Mn2CoAl] | 3.951 | 2.154 | 8.00 | 0.67 | -0.09 | 0.29 | 0.38 | 0.16 | -0.04 | 1.000 | no | yes |
| 1x[Fe2MnSi] / 2x[Mn2CoAl] | 3.973 | 2.150 | 7.00 | 0.58 | 0.01 | 0.32 | 0.31 | 0.12 | -0.01 | 1.000 | no | no |
| 2x[Fe2MnSi] / 2x[Mn2CoAl] | 3.972 | 2.862 | 10.00 | 0.63 | -0.10 | 0.26 | 0.36 | 0.19 | 0.06 | 1.000 | yes | yes |

FIG. 3G

| Chemical Templating Layer | $a_{TL}$, lattice constant (Å) | $a'_{TL} = a*$ Sqrt(2) (Å) |
|---|---|---|
| NiAl | 2.89 | 4.08646 |
| FeAl | 2.91 | 4.11474 |
| CoAl | 2.86 | 4.04404 |
| RuAl | 2.95 | 4.1713 |
| RhAl | 2.97 | 4.19958 |
| ReAl | 2.88 | 4.07232 |
| CoGa | 2.88 | 4.07232 |
| NiGa | 2.88 | 4.07232 |
| MnNi | 2.97 | 4.19958 |
| MnV | 2.94 | 4.15716 |
| FeTi | 2.98 | 4.21372 |
| CuZn | 2.95 | 4.1713 |
| BeTi | 2.94 | 4.15716 |
| CoSi | 2.82 | 3.98748 |
| OsSi | 2.96 | 4.18544 |
| RuSi | 2.91 | 4.11474 |
| AgF | 2.94 | 4.15716 |

FIG. 23

HALF METALLIC HEUSLER MULTILAYERS WITH PERPENDICULAR MAGNETIC ANISOTROPY

BACKGROUND

The present invention relates generally to the electrical, electronic and computer arts and, more particularly, to magnetoresistive random-access memory (MRAM).

Current MRAM devices use a magnetic tunnel junction (MTJ) as a storage element. A simple MTJ is a tri-layer structure containing two magnetic layers separated by a tunnel barrier layer. Thus, current MRAMs are three-layer devices employing a magnetic tunnel junction (MTJ). They typically include a reference layer magnet, a tunnel barrier, and a storage or free magnetic layer. The magnetic layer can either be a ferromagnet or a ferrimagnet. Current is passed through the device and the resistance is measured. The resistance changes based on the magnetic orientation of the two magnetic layers, and the relative change in resistance is referred to as the tunnel magnetoresistance (TMR), which is related to the spin polarization (i.e., high spin polarization implies high TMR). High spin polarization, and thus high TMR, is desirable (higher TMR provides a higher ON/OFF ratio). Low switching current is also desirable. In a parallel configuration, the magnetic layers have their magnetizations aligned with each other; the resistance is typically lower in this state relative to the anti-parallel configuration. In the anti-parallel state, the magnetic layers do not have their magnetizations aligned with each other; the resistance is typically higher in this state relative to the parallel configuration. The magnetic state of the MTJ is changed by passing a current through it. The current delivers spin angular momentum, so that once a threshold current is exceeded, the direction of the memory layer moment is switched. Since these MRAM devices are switched using Spin Transfer Torque (STT), they are referred to as STT-MRAM. The magnitude of the switching current that is required is less when the magnetization of the electrodes is oriented perpendicular to the layers. The magnetic layers have magnetization perpendicular to the film surface (i.e., have perpendicular magnetic anisotropy (PMA)) as smaller switching currents are needed than for in-plane magnetized MTJs. That is to say, MTJs with magnetic layers having PMA need smaller switching current than for in-plane magnetized layers.

Current devices employ alloys of cobalt, iron, and boron for the magnetic layers and these layers are ferromagnetic. Heusler compounds are magnetic intermetallics with a face-centered cubic (FCC) crystal structure and a composition of $X_2YZ$ (full-Heuslers or simply "Heuslers"), where X and Y are transition metals and Z is from the p-block (or main group) of the periodic table. Half Heuslers have the composition XYZ. Reference herein to Heusler or Heuslers without the term "half" is intended to reference full-Heuslers. Heusler compounds have four interpenetrating FCC sublattices.

BRIEF SUMMARY

Principles of the invention provide half metallic Heusler multilayers with perpendicular magnetic anisotropy (PMA). In one aspect, an exemplary magnetoresistive random-access memory cell includes a templating layer including a binary alloy having an alternating layer lattice structure; a half metallic Heusler multilayer structure including a plurality of layers of two different Heusler compounds, at least one of which is half metallic, the half metallic Heusler multilayer structure being located outward of the templating layer and exhibiting perpendicular magnetic anisotropy (PMA); a tunnel barrier outward of the half metallic Heusler multilayer structure; and a magnetic layer outward of the tunnel barrier.

Optionally, the half metallic Heusler multilayer structure has a periodic substructure selected from the group consisting of: a single layer of $Co_2MnSi$ alternated with a single layer of $Mn_2MnGe$, a single layer of $Co_2MnSi$ alternated with a double layer of $Mn_2MnGe$, a single layer of $Co_2MnGe$ alternated with a single layer of $Mn_2MnGe$, a single layer of $Co_2MnGe$ alternated with a double layer of $Mn_2MnGe$, a single layer of $Mn_2CoAl$ alternated with a single layer of $Mn_2MnAl$, and a single layer of $Co_2MnSb$ alternated with a single layer of $Mn_2MnAl$, advantageously providing, for example, high TMR, a high ON/OFF ratio, and/or cells exhibiting low magnetization perpendicular to the film plane, and thus low switching current.

In another aspect a magnetoresistive random-access memory array of such magnetoresistive random-access memory cells includes a plurality of bit lines and a plurality of complementary bit lines forming a plurality of bit line-complementary bit line pairs; a plurality of word lines intersecting the plurality of bit line pairs at a plurality of cell locations; and a plurality of magnetoresistive random-access memory cells located at each of the plurality of cell locations; each of the magnetoresistive random-access memory cells is electrically connected to a corresponding bit line and selectively interconnected to a corresponding one of the complementary bit lines under control of a corresponding one of the word lines. Each of the plurality of magnetoresistive random-access memory cells includes a templating layer including a binary alloy having an alternating layer lattice structure; a half metallic Heusler multilayer structure including a plurality of layers of two different Heusler compounds, at least one of which is half metallic, the half metallic Heusler multilayer structure being located outward of the templating layer and exhibiting perpendicular magnetic anisotropy (PMA); a tunnel barrier outward of the half metallic Heusler multilayer structure; and a magnetic layer outward of the tunnel barrier.

In a further aspect, a method of forming a magnetoresistive random-access memory cell includes providing a templating layer including a binary alloy having an alternating layer lattice structure; and epitaxially growing a half metallic Heusler multilayer structure on the templating layer. The half metallic Heusler multilayer structure includes a plurality of layers of two different Heusler compounds, at least one of which is half metallic, and the two different Heusler compounds are designated as "A" and "B." The "A" Heusler compound is a half metallic Heusler compound selected from the group consisting of $Mn_2FeSb$, $Mn_2CoSi$, $Mn_2MnAl$, $Co_2CrAl$, $Co_2CrGe$, $Co_2CrSi$, $Mn_2CoAl$, $Mn_2CuSi$, $Mn_2CoGe$, $Co_2MnSi$, $Co_2MnSb$, $Co_2MnGe$, $Mn_2CoAs$, $Mn_2FeAs$, $Fe_2MnSi$, and $Mn_2MnAs$. The "B" Heusler compound is selected from the group consisting of $Mn_3Ge$, $Mn_3Al$, $Mn_2CoSi$, and $Mn_2CoAl$. Further steps include forming a tunnel barrier outward of the half metallic Heusler multilayer structure; and forming a magnetic layer outward of the tunnel barrier.

In a still further aspect, a magnetoresistive random-access memory cell includes a magnetic layer; a tunnel barrier outward of the magnetic layer; and a half metallic Heusler multilayer structure comprising a plurality of layers of two different Heusler compounds, at least one of which is half metallic. The half metallic Heusler multilayer structure is located outward of the tunnel barrier and exhibits perpendicular magnetic anisotropy (PMA).

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

MRAM devices where the cells exhibit high spin polarization (via use of half metal with spin polarization of one), and thus high TMR, and a high ON/OFF ratio.

MRAM devices where the cells exhibit low magnetization, and thus low switching current, via use of a half metallic Heusler multilayer structure.

MRAM devices where the magnetic layers of the cells exhibit volume perpendicular magnetic anisotropy (PMA), allowing scaling to small sizes, via use of a half metallic Heusler multilayer structure.

Fabrication techniques using an underlayer (e.g., CoAl) to permit epitaxial growth of a half metallic Heusler multilayer structure.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 3A-3G present a table of half-metallic Heusler compounds that can be used in in MRAM multilayer structures according to aspects of the invention;

FIG. 23 shows non-limiting examples of chemical templating layers useful in one or more embodiments;

Figure 1:
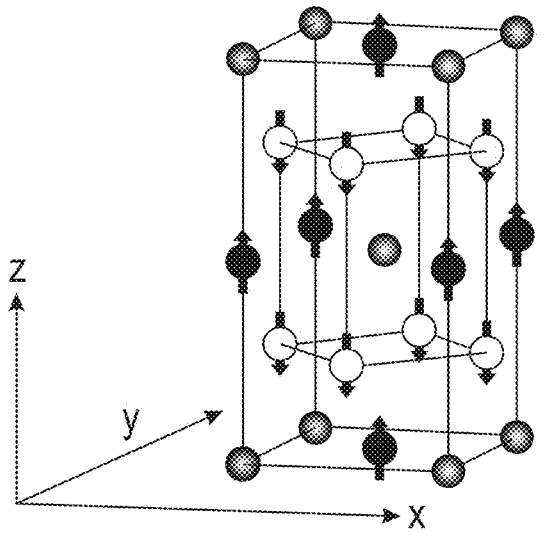
FIG. 1 shows a Heusler compound employed in aspects of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

We have found that multilayer structures of two half metallic Heusler compounds (or a half metallic Heusler compound with another near half metallic Heusler compound) are of interest for MRAM applications. Current MRAM devices use magnetic tunnel junction (MTJ) as a storage element. A simple MTJ is a tri-layer structure containing two magnetic layers separated by tunnel barrier layer. Current MTJs using Cobalt Iron Boron (Co/Fe/B) are able to provide magnetic layers which have magnetization perpendicular to the film surface (i.e. exhibit perpendicular magnetic anisotropy (PMA), which is desirable). The perpendicular magnetic anisotropy (PMA) of Co—Fe—B layers arises from the interfaces between these layers and the tunnel barrier and/or the underlayer on which the Co—Fe—B layer is deposited. Thus, these layers should be made sufficiently thin so that the interface PMA overcomes the demagnetization energy that arises from the magnetic volume and increases in proportion with the magnetic volume of the Co—Fe—B layer. However, their high moment requires a high switching current. One or more embodiments advantageously provide PMA but with lower moment and thus reduced switching current compared to prior art devices.

It is desirable that magnetic materials have volume PMA rather than surface (interfacial) PMA, as this enables scaling of devices to smaller sizes (typically smaller diameter). As device size is reduced, the devices become less thermally stable. However, for devices with volume anisotropy, it is advantageously possible to compensate for the lowering of thermal stability by increasing the thickness. The switching current is proportional to the product $(M_s \, V \, H_k)$ where $M_s$ is saturation magnetization, $V$ is volume, and $H_k$ is the anisotropy field. Low moment (i.e., low $M_s$) Heusler compounds need lower switching currents, unless the increase in $H_k$ overwhelms the lower $M_s$.

Thus, for MRAM applications, it is desirable that all the magnetic elements have their moments perpendicular to the layer itself (i.e., magnetization perpendicular to the film plane—PMA arising from the crystalline structure). Low magnetization and low switching currents are desirable. We have found that multilayer structures of two Heusler compounds [A/B/A/B/ . . . ] do not have cubic symmetry, so they have non-zero volume anisotropy and can exhibit PMA. Half metallic (HM) magnetic materials are materials that have a band gap at the Fermi energy, $E_F$, in one spin channel, so DOS(spin1, $E_F$)=0, and normal metallic DOS in another spin channel, so that DOS(spin2, $E_F$)>0 (DOS=densities of states)(only spins of one polarization available at the Fermi surface). Theoretically, such materials provide infinite TMR when used as electrodes in MRAM devices. Unfortunately, all known half metallic materials are cubic with zero volume anisotropy (due to symmetry), which property makes them unsuitable for practical MRAM devices. We have found that, advantageously, multilayer structures of two half metallic (HM) Heusler compounds (or a half metallic Heusler compound with another near half metallic Heusler compound) (A/B/A/B/ . . . ) can retain their half-metallic properties and simultaneously have PMA due to breaking the cubic symmetry, making them suitable for use in perpendicular MTJs.

Thus, one or more embodiments make use of the discovery that multilayer structures of two half metallic Heusler compounds (A/B/A/B/ . . . ) can keep their half-metallic properties and simultaneously have PMA due to breaking the cubic symmetry, advantageously employing same in perpendicular MTJs. Since the multilayer crystal structure in these novel multilayers is not cubic anymore, these multilayer compounds will have non-zero volume anisotropy and can exhibit PMA. Using DFT (Density-functional theory) calculations, we have determined that several A/B pairs of Heuslers with non-zero volume anisotropy and PMA are still half metallic. High TMR is expected for such compounds. We have accordingly identified a list of A/B pairs of Heusler compounds with non-zero volume anisotropy and PMA that are still half metallic.

Thus, one or more embodiments overcome the problem that known half metallic compounds are cubic with zero volume anisotropy, by providing a multilayer structure (A/B/A/B/ . . . ) including two HM compounds, exhibiting non-zero volume anisotropy due to breaking of the cubic symmetry.

Typically, Heusler compounds tend to be cubic. Thus, a thin film is grown, and the magnetic moment will be in the plane of the layer. For an MTJ for MRAM applications, it is highly desirable for the magnetic moments of the magnetic layer to be perpendicular to the layer. We have found that one way to address this is to use a half metallic Heusler multilayer structure with two different half metallic Heusler compounds (or a half metallic Heusler compound with another near half metallic Heusler compound). We have found that the multilayer structure breaks the cubic crystal symmetry, so that the magnetization can be perpendicular.

Further regarding half metallicity, every material has up spin and down spin. If there is a band gap in one of the spin channels, then at the Fermi level, if current is being passed, only one spin is moving. Half metals are very useful for achieving high TMR. Deposit the material on a templating layer (in a non-limiting example, a chemical templating layer), which forces the in-plane lattice constant to be different than the out-of-plane lattice constant. One or more embodiments ensure that the half-metallicity (i.e., having the band gap in one of the spin channels) is still maintained. We have found that there are a number of Heusler compounds that are half metals. There are about three thousand Heusler compounds. Less than one hundred are half metals.

A pertinent aspect of one or more embodiments is the growth of a Heusler multilayer structure on a templating layer. Suitable templating layers can, for example, be non-magnetic binary compounds (e.g., CoAl with in-plane lattice constant a=4.03 Å). While half-metallic Heusler compounds per se are well-known, heretofore, all known half-metallic Heusler compounds have exhibited a cubic crystal lattice structure and thus do not exhibit PMA.

One or more embodiments advantageously grow a Heusler multilayer structure on an underlayer (e.g., CoAl), obtaining volume anisotropy as opposed to interfacial anisotropy. In one or more embodiments, the Heusler multilayer structure is grown on a general substrate that can be, for example, a non-magnetic metal (e.g., CoAl) or a magnetic metal (e.g., cubic $Co_2MnSi$) and, therefore, the Heusler multilayer structure can be the bottom electrode of the MRAM cell. On the other hand, referring to FIGS. 27 and 28, in one or more embodiments, the Heusler multilayer structure is grown on a semiconductor/insulating barrier (e.g., MgO tunnel barrier), and, therefore, the Heusler multilayer structure can be the top electrode of the MRAM cell.

Figure 27:
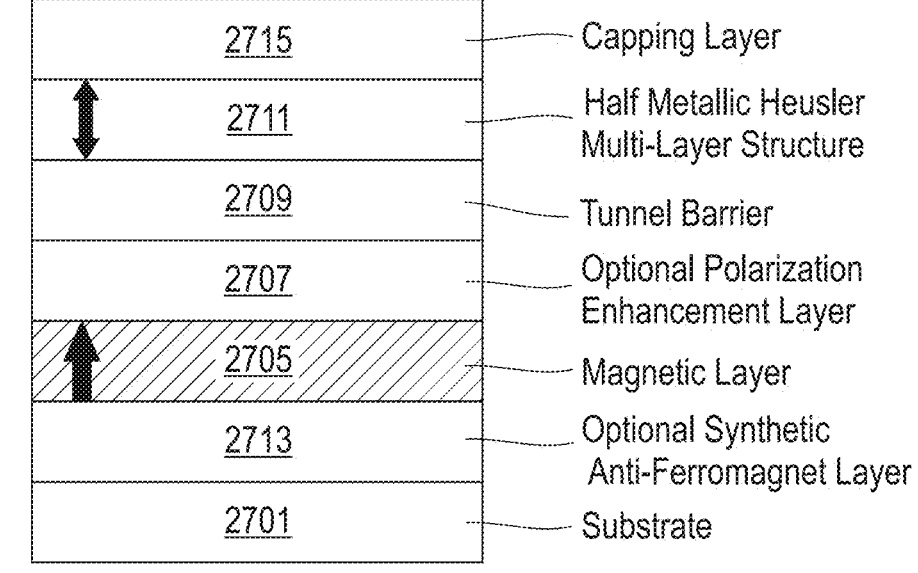
FIG. 27 shows a third exemplary MRAM cell, according to an aspect of the invention.

FIG. 27 shows an embodiment with a half metallic Heusler multilayer structure 2711 grown on the tunnel barrier 2709 and functioning as the top electrode. Structure 2711 functions as a storage layer as indicated by the double-headed arrow. Substrate 2701 is typically silicon with CMOS circuitry such as transistors and access lines permitting selection of individual devices. Other than the novel cells described herein, conventional transistors, access lines, peripheral circuits, and the like can be employed—refer to discussion of FIG. 6. Polarization enhancement layer 2707 is optionally located outward of layer 2705; layer 2707, where present, can include, for example, a thin layer of magnetic material such as cobalt. Tunnel barrier 2709 is located outward of layer 2707 (where present), else outward of layer 2705; barrier 2709 can include, for example, MgO, MgAl2O4, or the like. Magnetic layer 2705 functions as a reference layer and includes conventional cobalt, iron, nickel, or alloys, or could also include Heusler or half-Heusler materials. Synthetic anti-ferromagnet (SAF) layer 2713, where present, is located between layer 2705 and substrate 2701. Typically, a Synthetic Anti-Ferromagnet (SAF) layer includes a Co/Pt multilayer (not shown) that is magnetically coupled to the underlying magnetic layer to achieve needed performance. A thin layer (not shown) of Ta or Ir or Ru or Mo (order of few Å) may typically be interposed between the magnetic layer and the SAF layer. Cap layer 2715 is located outward of layer 2711. The cap layer may include Mo, W, Ta, Pt, Ru, or a combination thereof. In FIG. 27, the double-headed arrow indicates the storage layer wherein the magnetization can be changed, while single-headed arrow indicates the reference layer with constant/fixed magnetization. The purpose of the optional synthetic anti-ferromagnet layer 2713 is to prevent the magnetic field from changing and it is thus associated with the reference layer 2705.

Figure 28:
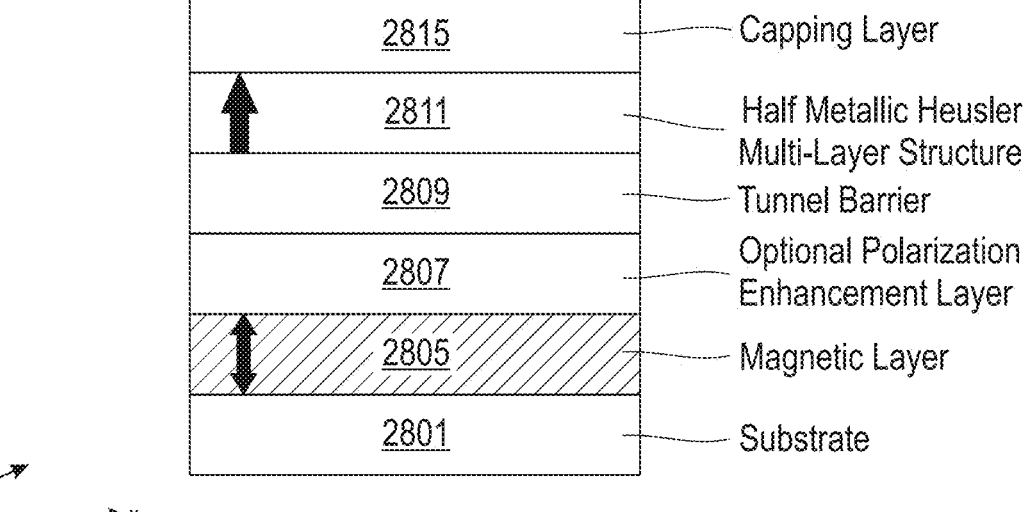
FIG. 28 shows a fourth exemplary MRAM cell, according to an aspect of the invention.

FIG. 28 shows an embodiment with a half metallic Heusler multilayer structure 2811 as a reference layer, grown on tunnel barrier 2809. Magnetic layer 2805 includes conventional cobalt, iron, nickel, or alloys, or could also include Heusler or half-Heusler materials, and is located outward of substrate 2801. Polarization enhancement layer 2807 is optionally located outward of layer 2805. Tunnel barrier 2809 is located outward of layer 2807 (where present), else outward of layer 2805. Cap layer 2815 is located outward of layer 2811. In FIG. 28, the double-headed arrow indicates the storage layer wherein the magnetization can be changed, while the single-headed arrow indicates the reference layer with constant/fixed magnetization. The comments regarding materials in FIG. 27 are generally applicable to FIG. 28 as well.

Again, it is worth noting that a half-metal is a substance that acts as a conductor to electrons of one spin orientation, but as an insulator or semiconductor to those of the opposite orientation. Known half-metals are ferromagnetic (or ferrimagnetic). In half-metals, the valence band for one spin orientation is partially filled while there is a gap in the density of states for the other spin orientation. This results in conducting behavior for only electrons in the first spin orientation. In some half-metals, the majority spin channel is the conducting one while in others the minority channel is.

One or more embodiments make use of a templating layer (in a non-limiting example, a chemical templating layer (CTL)). Referring to FIG. 1, consider now aspects of an exemplary chemical templating layer. A Heusler compound such as $Mn_3Ge$ includes alternating layers of Mn—Mn and Mn—Ge atoms. In FIG. 1, atoms with shading 301 represent Ge atoms (main group), atoms with shading 303 represent Mn atoms of the X-position in $X_2YZ$ (tetrahedrally coordinated by Z where Z=Ge), and atoms with shading 305 represent element Mn atoms of the Y-position in $X_2YZ$ (octahedrally coordinated by Z where Z=Ge). Mn is a transition metal and Ge is from the main group of the periodic table. One of the alternating layers contains transition metal atoms 303 only and other contains main group element atoms 301 along with transition metal atoms 305. Thus, a seed layer containing a single element which lattice-matches the in-plane lattice constant does not promote growth of an ordered Heusler compound at low temperatures such as room temperature. An ideal seed layer includes a binary compound of a transition element and a main group element. Moreover, this ideal seed layer also has an alternating layer structure containing these two distinct elements. One layer has only the transition metal. The other layer has only the main group metal (the "Z" in $X_2YZ$ is a main group metal as well). These binary compounds have a CsCl-like (cesium chloride-like) structure (where each cesium ion is coordinated by eight chloride ions). Exemplary templating layers include CoAl, CoGa, and the like.

Figure 2:
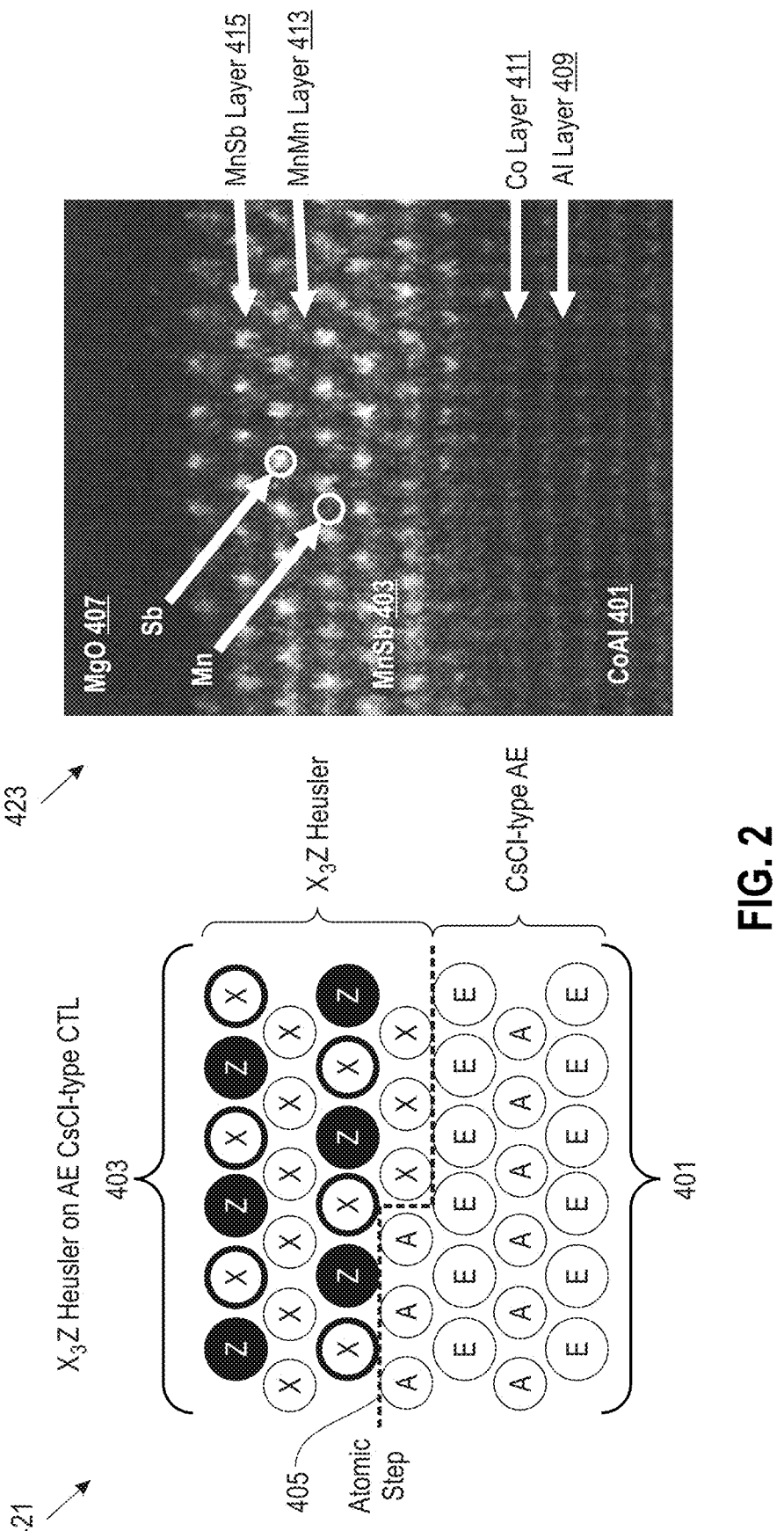
FIG. 2 shows growth of a Heusler compound on a templating layer according to aspects of the invention.

Referring now to FIG. 2, one or more embodiments employ a CsCl-type chemical templating layer (CTL) 401 (CoAl is an example of an excellent CsCl-type CTL) which promotes growth of an ordered Heusler compound even at ultrathin thicknesses and at room temperature. "E" can correspond, for example, to Al and "A" can correspond, for example, to Co. In FIG. 2, view 421 is a schematic while view 423 is a transmission electron microscopy (TEM) image. A Heusler compound such as $Mn_3Ge$ or $Mn_3Sn$ or $Mn_3Sb$ 403 grows epitaxially on top of the CoAl layer 401. The in-plane lattice constant of the ultrathin (<~25 Å) Heusler compound is similar to that of the CoAl CTL. It is possible to strain the Heusler to a differing extent with an appropriate choice of CTL. We have found that even ternary Heusler compounds can be ordered by the CTL. As illustrated, the Mn (generally, X) grows on the Al and the Ge (generally, Z) grows on the Co. Note the atomic step 405. The Heusler material can be strained and thus adopts the in-plane lattice constant of the template material. One or more embodiments impose the lattice constant of the templating layer onto the Heusler layer. In view 423, note that CoAl 401 includes Al layers 409 and Co layers 411 and the $Mn_3Sb$ includes MnMn layer 413 and MnSb layer 415. Note the MgO tunnel barrier 407. The three most prominent tetragonal compounds are $Mn_3Ge$, $Mn_3Sn$, and $Mn_3Sb$, and $Mn_3Sb$ has a larger difference in Z between Mn and Sb and thus is easier to see in the TEM image 423. Note that FIG. 2 depicts growth of Heusler compound 403 but similar principles can be applied to growth of Heusler multilayer structures as disclosed herein.

We considered 16 half metallic (HM) Heusler compounds. For component "A" in the "A/B" multilayer (FIGS. 7-22 discuss various multilayer structures), we considered $Mn_2FeSb$, $Mn_2CoSi$, $Mn_2MnAl$, $Co_2CrAl$, $Co_2CrGe$, $Co_2CrSi$, $Mn_2CoAl$, $Mn_2CuSi$, $Mn_2CoGe$, $Co_2MnSi$, $Co_2MnSb$, $Co_2MnGe$, $Mn_2CoAs$, $Mn_2FeAs$, $Fe_2MnSi$, and $Mn_2MnAs$. We considered A/B pairs with 4 B-compounds: $Mn_3Ge$, $Mn_3Al$, $Mn_2CoSi$, and $Mn_2CoAl$. Note that only $Mn_3Ge$ is not half-metallic in this list. For each A/B pair, we considered 4 multilayer structures: 1×A/1×B, 2×A/1×B, 1×A/2×B, and 2×A/2×B. For B=$Mn_3Al$, $Mn_2CoSi$, or $Mn_2CoAl$, we considered 15 A-compounds and for B=$Mn_3Ge$ we considered 12 A-compounds. Thus, we considered a total of 216 multilayer structures. Using DFT calculations, we found that the majority of these A/B multilayers are HM or near-HM with a large spin polarization SP>0.95 (near-HM means that the band gap is slightly above or below the Fermi energy). Some small portion of the A/B multilayers we studied were found not to be HM with relatively small spin polarization.

Figure 10:
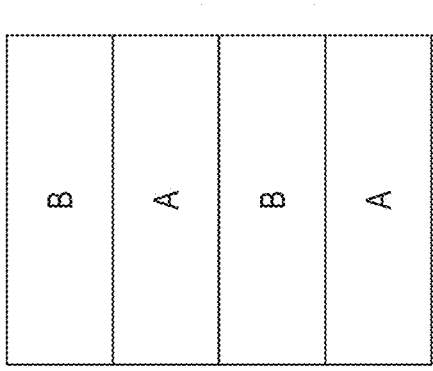
FIGS. 7-22 show different Heusler multilayer structures, according to aspects of the invention.
Figure 9:
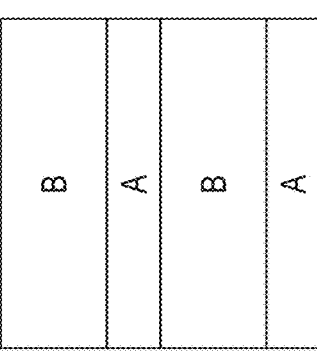
Figure 8:
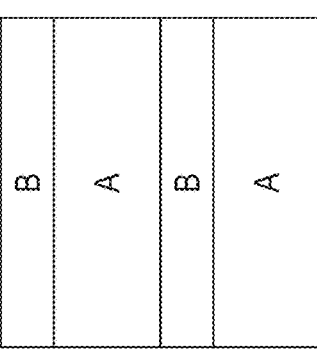
Figure 7:
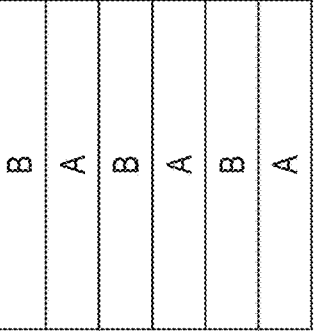
Figure 14:
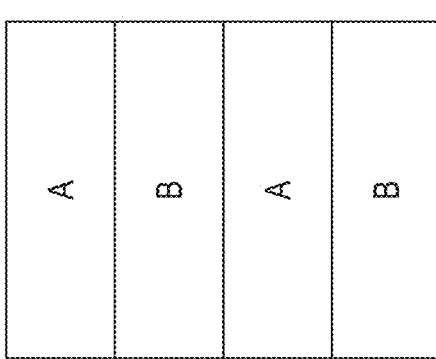
Figure 13:
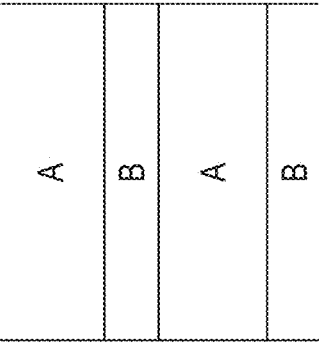
Figure 12:
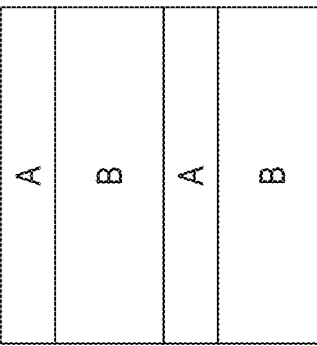
Figure 11:
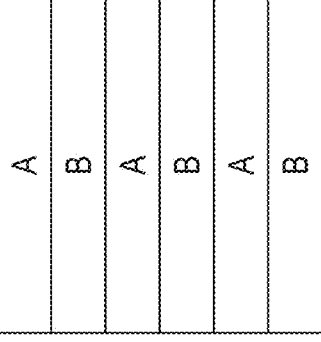
Figure 18:
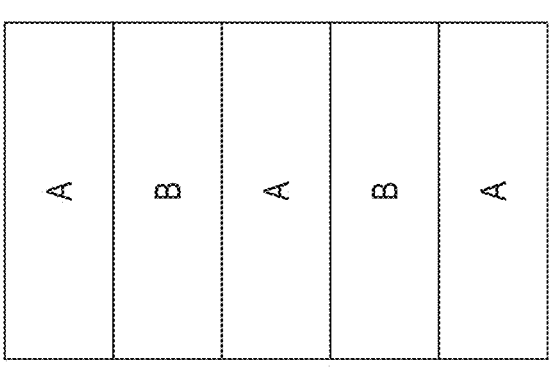
Figure 17:
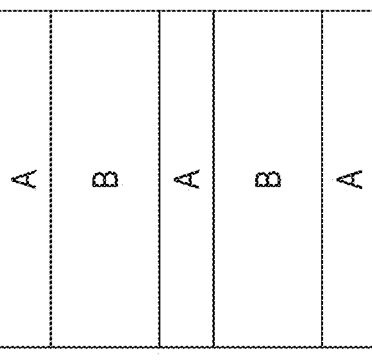
Figure 16:
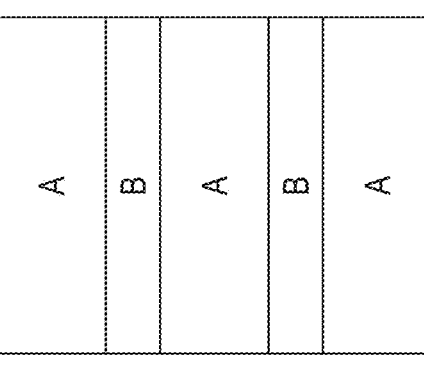
Figure 15:
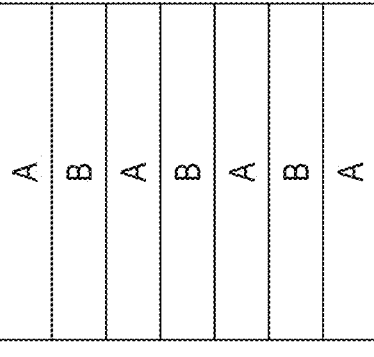
Figure 22:
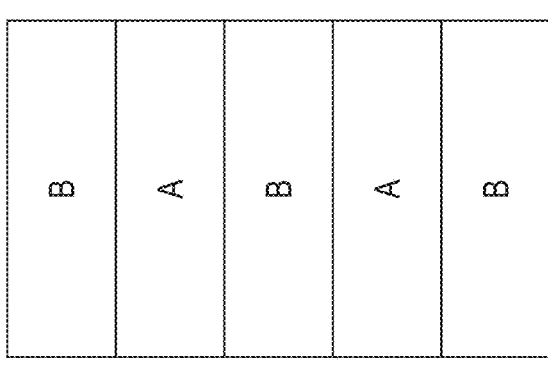
Figure 21:
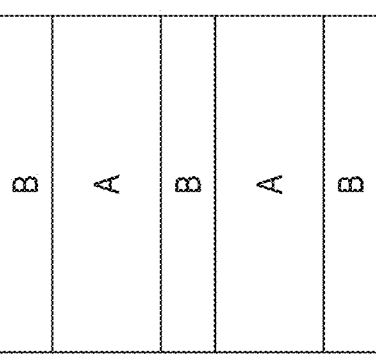
Figure 20:
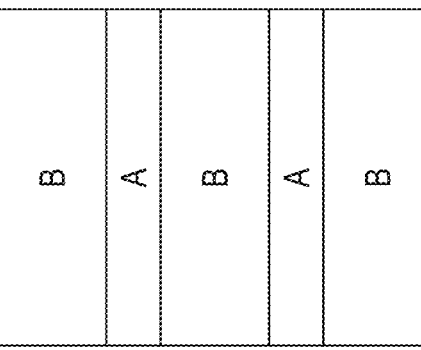
Figure 19:
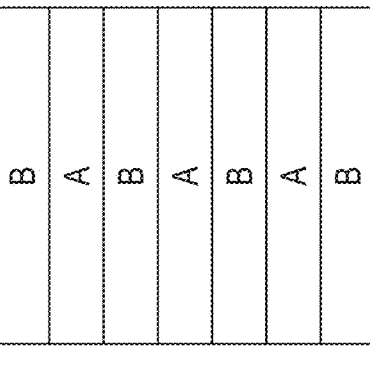

Attention should now be given to FIGS. 7-22. FIG. 7 shows a multilayer structure with three complete repetitions of the 1×A/1×B configuration; FIG. 8 shows a multilayer structure with two complete repetitions of the 2×A/1×B configuration; FIG. 9 shows a multilayer structure with two complete repetitions of the 1×A/2×B configuration; and FIG. 10 shows a multilayer structure with two complete repetitions of the 2×A/2×B configuration. FIG. 11 shows a multilayer structure with three complete repetitions of the 1×B/1×A configuration; FIG. 12 shows a multilayer structure with two complete repetitions of the 2×B/1×A configuration; FIG. 13 shows a multilayer structure with two complete repetitions of the 1×B/2×A configuration; and FIG. 14 shows a multilayer structure with two complete repetitions of the 2×B/2×A configuration. FIG. 15 shows a multilayer structure with three complete repetitions of the 1×A/1×B configuration and an additional A sublayer; FIG. 16 shows a multilayer structure with two complete repetitions of the 2×A/1×B configuration and an additional 2×A sublayer; FIG. 17 shows a multilayer structure with two complete repetitions of the 1×A/2×B configuration and an additional A sublayer; and FIG. 18 shows a multilayer structure with two complete repetitions of the 2×A/2×B configuration and an additional 2×A sublayer. FIG. 19 shows a multilayer structure with three complete repetitions of the 1×B/1×A configuration and an additional B sublayer; FIG. 20 shows a multilayer structure with two complete repetitions of the 2×B/1×A configuration and an additional 2×B sublayer; FIG. 21 shows a multilayer structure with two complete repetitions of the 1×B/2×A configuration and an additional B sublayer; and FIG. 22 shows a multilayer structure with two complete repetitions of the 2×B/2×A configuration and an additional 2×B sublayer.

Referring to the table in FIGS. 3A-3G, from the 216 multilayers that were studied, we identified 69 multilayers having PMA; 191 multilayers that are HM or near-HM (in particular, 121 multilayers are true HM with spin polarization=100% (8 for A/B with B=$Mn_3Ge$), while 70 multilayers are near-HM with spin polarization 95%<SP<100% (37 for A/B with B=$Mn_3Ge$)); 34 multilayers that are HM and simultaneously have PMA; and 23 multilayers that are near-HM with spin polarization 95%<SP<100% and simultaneously have PMA. In FIGS. 3A-3G, the configurations labeled "most promising" are the six best from the list. The light gray shading indicates a desirable property in the given column such as half metallic, exhibits PMA, and high Spin Polarization. Generally, PMA and half-metallicity are desired. Black shading indicates strong PMA. The entries labeled "most promising" indicate a large PMA value and half metallicity, as indicated numerically in the table.

The following 6 multilayers are believed to be particularly advantageous. The theoretical calculations can be done, for example, for an infinite number of layers. In one or more practical embodiments, there are typically, for example, 1-3 of the repeating units. For example, if the pattern is AB, one could have AB, ABAB, or ABABAB; or ABA, ABABA, or ABABABA. More repetitions imply more magnetic material and thus a higher moment and larger switching current, resulting in a tradeoff. In one or more embodiments, the layers grow epitaxially on top of each other, starting with the first layer grown on the templating layer. In a non-limiting example, the thickness of each layer is 7-8 Å; further discussions regarding thickness are provided elsewhere herein. In one or more embodiments, the double layers AA, BB are simply a double thickness. In one or more non-limiting exemplary embodiments, each single layer has a thickness of one unit cell while each double layer has a thickness of two unit cells; however, several percent (even ~12%) of thickness fluctuations per layer are possible—for example, ±~12%. The order of the layers can be reversed, i.e., B/A instead of A/B. Furthermore, it is possible to have the same terminating layer on either side e.g. A/B . . . /A or B/A . . . /B—a full "period" of pattern recognition is not necessarily required.

$$1x[C_{O2}MnSi]/1x[Mn_2MnGe],$$

$$1x[C_{O2}MnSi]/2x[Mn_2MnGe],$$

$$1x[C_{O2}MnGe]/1x[Mn_2MnGe],$$

$$1x[C_{O2}MnGe]/2x[Mn_2MnGe],$$

$$1x[Mn_2CoAl]/1x[Mn_2MnAl],$$

$$1x[C_{O2}MnSb]/1x[Mn_2Al].$$

These multilayer structures are HM and have PMA with an anisotropy constant $K_v > 0.3$ MJ/m$^3$ ("large" PMA). The fully relaxed in-plane lattice constant of the first five of these systems matches, to within <1%, the in-plane lattice constant of 4.03 Å for CoAl. We have established CoAl to be a robust templating layer for Heusler compounds. The fully relaxed in-plane lattice constant of the last system in the list, $1x[Co_2MnSb]/1x[Mn_2MnAl]$, is 4.13 Å. This in-plane lattice constant matches, within <1%, the in-plane lattice constant of chemical templating layers such as RuAl (4.17 Å), FeAl (4.11 Å), and RuSi (4.11 Å). RuAl and FeAl have been established as templating layers for Heusler compounds. The multilayer candidate system, $1x[Mn_2CoAl]/1x[Mn_2MnAl]$, has the lowest magnetic moment per unit cell (comparable to that of $Mn_3Ge$) which will advantageously facilitate a low switching current.

The table of FIGS. 3A-3G thus depicts the results of theoretical calculations. Only multilayer structures that have at least one multilayer with PMA ($K_v > 0$) were included. In the column headings, a is the lattice constant in Angstroms (Å) along the x axis, c is the lattice constant in Angstroms (Å) along the z axis, c/a is the dimensionless ratio of c to a, mom is the magnetic moment in Bohr magneton ($\mu_B$), mom/at is the magnetic moment per atom in Bohr magneton ($\mu_B$), $E_{min}$ is minimum band gap energy where the band gap starts in electron volts (eV), $E_{max}$ is maximum band gap energy where the band gap ends in electron volts (eV), $E_g$ is the value of the band gap in electron volts (eV) (difference between $E_{max}$ and $E_{min}$), $K_{sh}$ is shape anisotropy in milli-electronvolts (meV), and $K_v = K_{mc} - K_{sh}$, expressed in Megajoules per cubic meter (MJ/m$^3$) where $K_{mc}$ is magnetocrystalline anisotropy. $K_v$ is indicative of PMA and should be >0 for materials with PMA. SP is spin polarization, PMA indicates whether the layer system exhibits perpendicular magnetic anisotropy (PMA), and HM indicates whether the layer system exhibits half metallicity (HM).

As noted, the half metallic Heusler multilayer structure can be produced via growth on a suitable templating layer. By way of review, in a templating concept a templating layer is grown and another layer (e.g., Heusler compound) is grown on top of it. Templating essentially means that the layer being grown on the templating layer grows to the lattice constant a of the underlayer/seed layer. Analogously to Poisson's ratio, changing a also changes c; if a shrinks, c increases (and the opposite, if a grows, c shrinks). Since the lattice constant a for the Heusler multilayer structure is larger than the lattice constant for the templating layer ($a_{TL}$), the Heusler multilayer structure rotates by 45° to lattice match the templating layer. The material seeks to conserve its unit cell volume. Referring again to FIG. 2, CoAl is a layered structure. In the Heusler compound 403, the all-Mn layer, because it contains only a transition metal, prefers to grow on the Al of the templating layer, while the MnSb layer, because it also has a main group element, prefers to grow on the Co of the templating layer, and thus ordering is obtained in the material 403. Atomic steps 405 are inherent in the templating layer 401 but do not disturb the ordering in the Heusler material 403.

FIG. 23 shows candidate CTL materials. Note that $a_{TL}$, the in-plane lattice constant, for several CTL materials, can be tuned over a large range of values. These "$a_{TL}$" values can also be adjusted further with strain induced from the underlying seed layer and/or via a change in composition from the nominal 1:1 value. Different lattice constants can be "mixed and matched" in one or more embodiments. Further regarding "mix and match," note, for example, that CoAl has a lattice constant of 2.86 Å while RuAl has a lattice constant of 2.95 Å. In principle, if the Heusler multilayer structure is grown on the RuAl, the Heusler multilayer structure will try to conform to the RuAl lattice constant, and thus will be stretched differently than if grown on CoAl.

Figure 4:
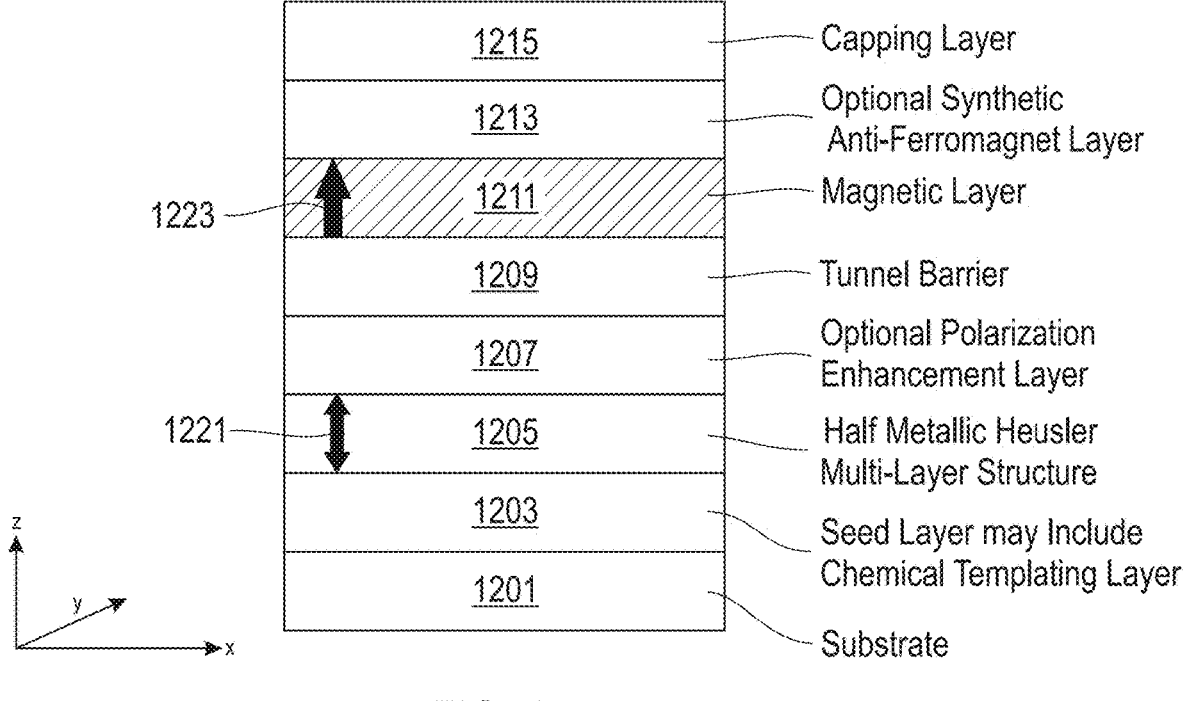
FIG. 4 shows a first exemplary MRAM cell, according to an aspect of the invention.

FIG. 4 shows an embodiment with a half metallic Heusler multilayer structure as a storage layer 1205. The seed layer 1203 will typically include the CTL, and is located on substrate 1201. Substrate 1201 is typically silicon with CMOS circuitry such as transistors and access lines permitting selection of individual devices. Other than the novel cells described herein, conventional transistors, access lines, peripheral circuits, and the like can be employed—refer to discussion of FIG. 6 below. The CTL or even a multilayer of CTLs can be grown on a suitable surface such as directly on the substrate if possible, or more typically on a seed layer deposited on the substrate. Non-limiting examples of seed layers include tantalum, tantalum-ruthenium, chromium, manganese, manganese nitride, scandium nitride or the like. Half metallic Heusler multilayer structure 1205 is located on the CTL, and can be formed, for example, by epitaxial growth on the CTL, with subsequent layers epitaxially grown on the preceding layers. Polarization enhancement layer 1207 is optionally located outward of layer 1205; layer 1207, where present, can include, for example, a thin layer of magnetic material such as cobalt. Tunnel barrier 1209 is located outward of layer 1207 (where present), else outward of layer 1205; barrier 1209 can include, for example, MgO, MgAl$_2$O$_4$, or the like. Magnetic layer 1211 includes conventional cobalt, iron, nickel, or alloys, or could also include Heusler or half-Heusler materials. Synthetic anti-ferromagnet (SAF) layer 1213, where present, is located outward of layer 1211. Typically, a Synthetic Anti-Ferromagnet (SAF) layer includes a Co/Pt multilayer (not shown) that is magnetically coupled to the underlying magnetic layer to achieve needed performance. A thin layer (not shown) of Ta or Ir or Ru or Mo (order of few Å) may typically be interposed between the magnetic layer and the SAF layer. Cap layer 1215 is located outward of layer 1213 (where present), else outward of layer 1211. The cap layer may include Mo, W, Ta, Pt, Ru, or a combination thereof. In FIG. 4, double-headed arrow 1221 indicates the storage layer wherein the magnetization can be changed, while single-headed arrow 1223 indicates the reference layer with constant/fixed magnetization.

Figure 5:
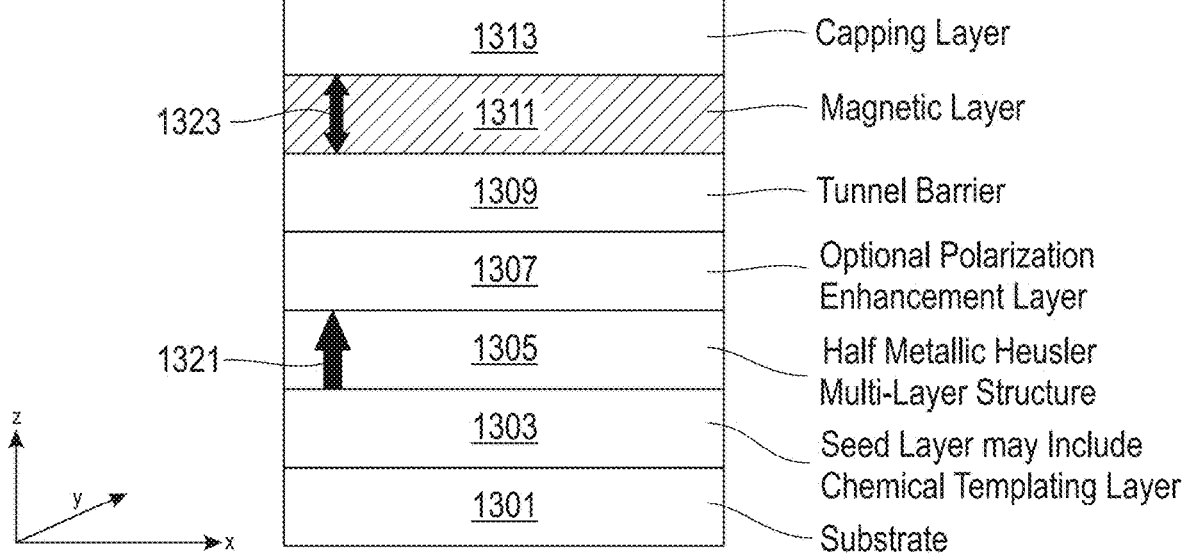
FIG. 5 shows a second exemplary MRAM cell, according to an aspect of the invention.

FIG. 5 shows an embodiment with a half metallic Heusler multilayer structure as a reference layer. The seed layer 1303 will typically include the CTL, and is located on substrate 1301. Half metallic Heusler multilayer structure 1305 is located on the CTL, and can be formed, for example, by epitaxial growth on the CTL. Polarization enhancement layer 1307 is optionally located outward of layer 1305. Tunnel barrier 1309 is located outward of layer 1307 (where present), else outward of layer 1305. Magnetic layer 1311 includes conventional cobalt, iron, nickel, or alloys, or could also include Heusler or half-Heusler materials. Cap layer 1313 is located outward of layer 1311. In FIG. 5, double-headed arrow 1323 indicates the storage layer wherein the magnetization can be changed, while single-headed arrow 1321 indicates the reference layer with constant/fixed magnetization. The comments regarding materials in FIG. 4 are generally applicable to FIG. 5 as well.

In both FIG. 4 and FIG. 5, the Heusler multilayer structure is typically located on top of the templating layer, due to the epitaxial growth in the fabrication process.

One or more embodiments thus provide a device, including a layered structure, which layered structure in turn includes a first layer which is non-magnetic at room temperature, including a binary alloy with CsCl structure having a target in plane lattice constant (for example, CoAl has an in-plane lattice constant of 4.03 Å and a second layer that includes a multilayer structure of a half metallic Heusler compound with $Mn_3Ge$ or $Mn_3Al$ such that the resultant multilayer structure is half metallic and whose magnetization is substantially perpendicular to the layer.

The half metallic Heusler compound can be, for example, $Co_2MnSi$, or $Co_2MnGe$, $Mn_2CoAl$ or $Co_2MnSb$.

Such a half metallic Heusler layer can have a thickness of, for example, one unit cell within the multilayer structure (e.g., nominally ~8 Å for one material and nominally ~16 Å for "AB" or "BA" configurations).

The binary alloy with the CsCl structure can be represented by $A_{1-x}E_x$, where A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55.

In some instances, a tunnel barrier is provided in contact with the half metallic Heusler multilayer structure. MgO is a non-limiting example of a tunnel barrier.

In one or more embodiments, the half metallic Heusler multilayer structure is chosen from the group consisting of $1\times[Co_2MnSi]/1\times[Mn_2MnGe]$, $1\times[Co_2MnSi]/2\times[Mn_2MnGe]$, $1\times[Co_2MnGe]/1\times[Mn_2MnGe]$, $1\times[Co_2MnGe]/2\times[Mn_2MnGe]$, $1\times[Mn_2CoAl]/1\times[Mn_2MnAl]$, and $1\times[Co_2MnSb]/1\times[Mn_2MnAl]$.

In some embodiments, the binary alloy with CsCl structure is represented by $A_{1-x}E_x$, where A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55.

In some instances, a tunnel barrier is provided in contact with the half metallic Heusler multilayer structure. MgO is a non-limiting example of a tunnel barrier.

As will be appreciated by the skilled artisan, typically, the magnetization is not fixed, but rather, the magnetization processes like a spinning top at a non-zero temperature. This can change depending on temperature. In view of this precession, perpendicularity, as used herein, refers to perpendicularity of the time integral/average of the path of the magnetization. The time integral/average of the path of the magnetization could be, for example, "exactly" perpendicular, perpendicular within ±5%, or perpendicular within ±10%.

In some such cases, the templating layer or chemical templating layer which is a binary alloy is represented by $A_{1-x}E_x$, wherein A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55. In some such cases, a tunnel barrier 1209, 1309 is located in contact with the half metallic Heusler multilayer structure; the tunnel barrier can include, for example, MgO (magnesium aluminum oxide is a suitable alternative to MgO with magnesium aluminum oxide having the form $Mg_{1-z}Al_{2+(2/3)z}O_4$, wherein $-0.5<z<0.5$).

It should be noted that the Heusler compounds within the Heusler multilayer structure are indicated by stoichiometric formulas and this does not preclude small variations of up to several % from the nominal values.

The templating layers could include any of the materials listed in FIG. 23 but are not limited to those materials.

Figure 6:
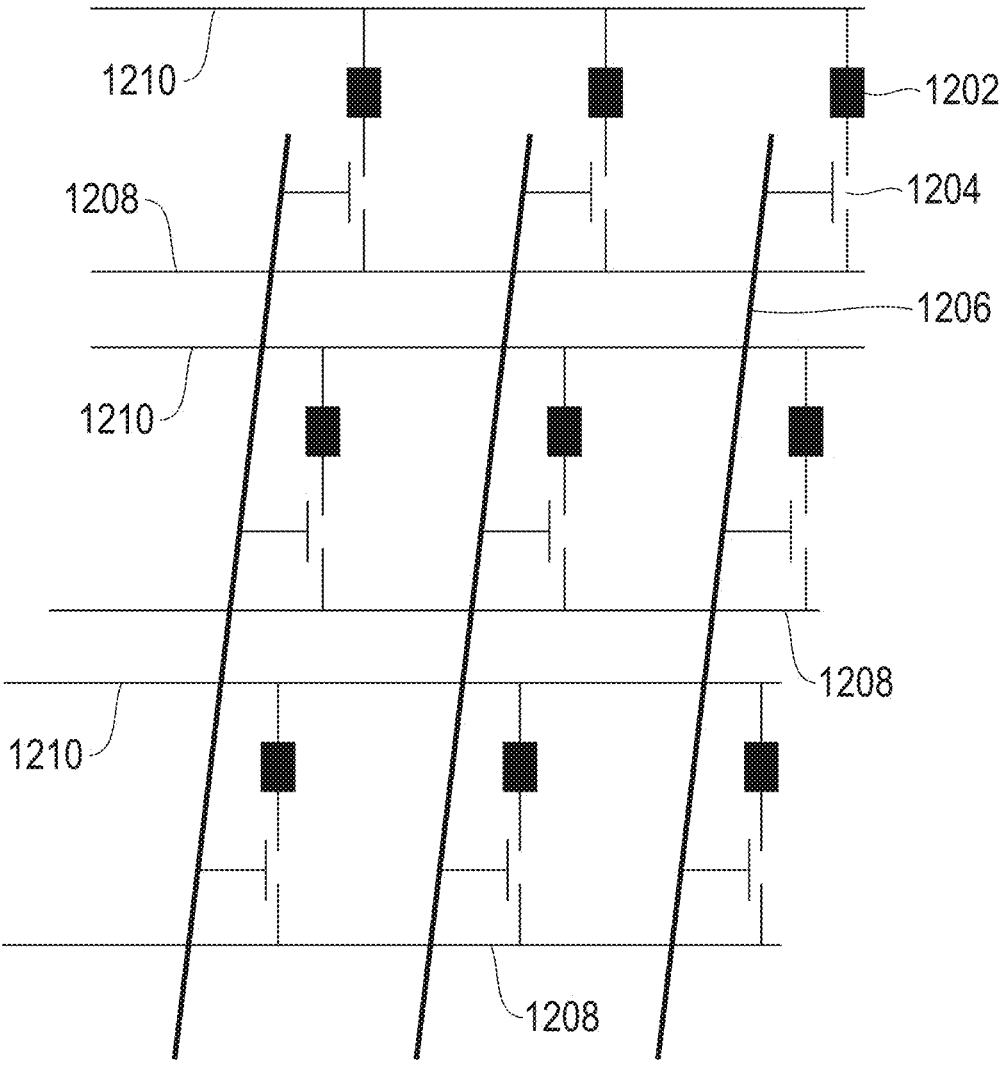
FIG. 6 shows an array of MRAM cells, according to an aspect of the invention.

Referring now to FIG. 6, an array of MRAM devices 1202 is shown. Each cell 1202 (e.g., embodiments of FIG. 4, 5, 27 or 28) is connected to a respective transistor 1204 that controls reading and writing. A word line 1206 provides data to write to the cells 1202, while a bit line 1210 and a bit line complement 1208 read data from the cell 1202. In this manner, a large array of memory devices can be implemented on a single chip. An arbitrarily large number of cells 1202 can be employed, within the limits of the manufacturing processes and design specifications.

Writing data to a cell 1202 includes passing a current through the cell. This current causes the direction of magnetization to switch between a parallel or anti-parallel state, which has the effect of switching between low resistance and high resistance states. Because this effect can be used to represent the 1s and 0s of digital information, the cells 1202 can be used as a non-volatile memory. Passing the current in one direction through the cell 1202 causes the magnetization of the free layer 1205, 1311 to be parallel with that of the reference layer 1211, 1305, while passing the current in the opposite direction through the cell 1202 causes the magnetization of the free layer 1205, 1311 to be antiparallel to that of the reference layer 1211, 1305. Reading the bit stored in a cell 1202 involves applying a voltage (lower than that used for writing information) to the cell 1202 to discover whether the cell offers high resistance to current ("1") or low resistance ("0").

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, ion milling, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method, including the epitaxial growth of the Heusler multilayer structure on the templating layer, and the structures formed thereby, are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary magnetoresistive random-access memory cell (see FIGS. 4 and 5), according to an aspect of the invention, includes a templating layer (e.g., within seed layer 1203, 1303) including a binary alloy having an alternating layer lattice structure (see FIG. 2); and a half metallic Heusler multilayer structure 1205, 1305 including a plurality of layers of two different Heusler compounds, at least one of which is half metallic (see FIGS. 7-22, for example). The half metallic Heusler multilayer structure is located outward of the templating layer and exhibits perpendicular magnetic anisotropy (PMA) (for example, due to breaking of cubic symmetry). As will be appreciated by the skilled artisan, the half metallic Heusler multilayer structure typically exhibits PMA in that it has magnetization substantially perpendicular to the half metallic Heusler multilayer structure. Also included are a tunnel barrier 1209, 1309 outward of the half metallic Heusler multilayer structure, and a magnetic layer 1211, 1311 outward of the tunnel barrier.

Regarding the characterization of the half metallic Heusler multilayer structure 1205, 1305 including a plurality of layers of two different Heusler compounds, at least one of which is half metallic, in some instances, the half metallic Heusler multilayer structure includes a plurality of layers of two different Heusler compounds, one of which is half metallic and the other of which is near half-metallic; in some instances, the half metallic Heusler multilayer structure includes a plurality of layers of two different Heusler compounds, both of which are half metallic; in some instances, the half metallic Heusler multilayer structure includes a plurality of layers of two different Heusler compounds, one of which is half metallic and the other of which is $Mn_3Ge$ which is not half metallic.

In one or more embodiments, the two different Heusler compounds are designated as "A" and "B"; the "A" Heusler compound is a half metallic Heusler compound selected from the group consisting of $Mn_2FeSb$, $Mn_2CoSi$, $Mn_2MnAl$, $Co_2CrAl$, $Co_2CrGe$, $Co_2CrSi$, $Mn_2CoAl$, $Mn_2CuSi$, $Mn_2CoGe$, $Co_2MnSi$, $Co_2MnSb$, $Co_2MnGe$, $Mn_2CoAs$, $Mn_2FeAs$, $Fe_2MnSi$, and $Mn_2MnAs$; and the "B" Heusler compound is selected from the group consisting of $Mn_3Ge$, $Mn_3Al$, $Mn_2CoSi$, and $Mn_2CoAl$ (all of which, with exception of $Mn_3Ge$, are half metallic).

In some such embodiments, the half metallic Heusler multilayer structure has at least one complete periodic substructure and no more than three periodic substructures, selected from the group consisting of 1×A/1×B, 2×A/1×B, 1×A/2×B, 2×A/2×B, 1×B/1×A, 2×B/1×A, 1×B/2×A, 2×B/2×A. The periodic substructure is the smallest repeating pattern.

In some instances, the half metallic Heusler multilayer structure has a periodic substructure selected from the group consisting of: a single layer of $Co_2MnSi$ alternated with a single layer of $Mn_2MnGe$, a single layer of $Co_2MnSi$ alternated with a double layer of $Mn_2MnGe$, a single layer of $Co_2MnGe$ alternated with a single layer of $Mn_2MnGe$, a single layer of $Co_2MnGe$ alternated with a double layer of $Mn_2MnGe$, a single layer of $Mn_2CoAl$ alternated with a single layer of $Mn_2MnAl$, and a single layer of $Co_2MnSb$ alternated with a single layer of $Mn_2MnAl$.

In some instances, the half metallic Heusler multilayer structure has a periodic substructure selected from the group consisting of: a single layer of $Co_2MnSi$ alternated with a single layer of $Mn_2MnGe$, a single layer of $Co_2MnSi$ alternated with a double layer of $Mn_2MnGe$, a single layer of $Co_2MnGe$ alternated with a single layer of $Mn_2MnGe$, a single layer of $Co_2MnGe$ alternated with a double layer of $Mn_2MnGe$, and a single layer of $Mn_2CoAl$ alternated with a single layer of $Mn_2MnAl$; and the templating layer includes CoAl.

In some instances, the half metallic Heusler multilayer structure has a periodic substructure including a single layer of $Co_2MnSb$ alternated with a single layer of $Mn_2MnAl$; and the templating layer is selected from the group consisting of RuAl, FeAl, and RuSi.

In one or more embodiments, each single layer has a thickness of 1 unit cell (nominally ~8 Angstroms) and each double layer has a thickness of 2 unit cells (nominally ~16 Angstroms)—the thickness is generally analogous to height in the Z direction in FIG. 1. In one or more embodiments, each single layer has a thickness of 1±0.1 unit cell and each double layer has a thickness of 2±0.2 unit cells.

In some cases (FIG. 4), the half metallic Heusler multilayer structure includes a storage layer; and the magnetic layer includes a reference layer.

The tunnel barrier can be selected from the group consisting of magnesium oxide and magnesium aluminum oxide.

In some cases, the binary alloy is represented by $A_{1-x}E_x$, wherein A is a transition metal element and E is a main group element including at least one of aluminum and gallium, and x is in the range from 0.42 to 0.55.

In some cases (FIG. 5), the half metallic Heusler multilayer structure includes a reference layer; and the magnetic layer includes a storage layer.

In one or more embodiments, the alternating layer lattice structure of the templating layer includes a cesium chloride structure. See FIG. 2.

In one or more instances, the templating layer is nonmagnetic at room temperature.

In one or more embodiments, the half metallic Heusler multilayer structure has a calculated half metallic Heusler multilayer structure in-plane lattice constant determined from energy minimization calculations; and the templating layer has a templating layer in-plane lattice constant that matches the calculated half metallic Heusler multilayer structure in-plane lattice constant determined from energy minimization calculations within plus or minus 2%.

In one or more embodiments, the half metallic Heusler multilayer structure has a calculated half metallic Heusler multilayer structure in-plane lattice constant determined from energy minimization calculations; and the templating layer has a templating layer in-plane lattice constant that matches the calculated half metallic Heusler multilayer structure in-plane lattice constant to within plus or minus 2%. More generally, the templating layer has a templating layer in-plane lattice constant, which substantially matches the calculated half metallic Heusler multilayer structure in-plane lattice constant determined from energy minimization calculations. As used herein, the templating layer in-plane lattice constant substantially matches the calculated half metallic Heusler multilayer structure in-plane lattice constant determined from energy minimization calculations when it matches the calculated half metallic Heusler multilayer structure in-plane lattice constant determined from energy minimization calculations or when the in-plane lattice constant of the Heusler multilayer structure (as grown on the templating material) has moved towards the in-plane lattice constant of the templating material from the calculated half metallic Heusler multilayer structure in-plane lattice constant determined from energy minimization calculations. In some cases, the templating layer in-plane lattice constant matches the calculated half metallic Heusler multilayer structure in-plane lattice constant determined from energy minimization calculations within ±10%. In some cases, the templating layer in-plane lattice constant matches the calculated half metallic Heusler multilayer structure in-plane lattice constant determined from energy minimum calculations within ±5%. The Heusler multilayer structure has, for example, a magnetization substantially perpendicular to the Heusler multilayer structure.

In one or more embodiments, the half metallic Heusler multilayer structure lattice constant matches the templating layer "exactly" or "almost exactly" when grown on the templating layer. The half metallic Heusler multilayer structure has a nominal/calculated value of lattice constant (determined from energy minimization calculations) when not grown on the templating layer. In one or more embodiments, select the templating layer to match that within ±2%. When grown on the templating layer, the multilayer matches the templating layer "exactly" or "almost exactly." For example, in FIG. 3B, top row, a is the in-plane lattice constant—4.000 Å is a target value, from energy minimization calculations, but the templating layer does not need to hit it exactly, within a ±1-2% range is acceptable in one or more embodiments (other embodiments can match within a different percentage). Each promising candidate has a different a value. So, this a is the calculated value for the composite multilayer and it is desired to get the templating layer to match it within ±1-2%, for example. The multilayer structure breaks symmetry which allows for PMA. In one or more embodiments, the multilayer structure becomes tetragonal because of strain but that is not the goal in one or more embodiments, rather, what is sought is a lattice constant that allows for PMA.

In another aspect, referring to FIG. 6, a magnetoresistive random-access memory array includes a plurality of bit lines 1210 and a plurality of complementary bit lines 1208 forming a plurality of bit line-complementary bit line pairs. A plurality of word lines 1206 intersect the plurality of bit line pairs at a plurality of cell locations. A plurality of magnetoresistive random-access memory cells 1202 are located at each of the plurality of cell locations. Each of the magnetoresistive random-access memory cells 1202 is electrically connected to a corresponding bit line 1210 and selectively interconnected to a corresponding one of the complementary bit lines 1208 under control of a corresponding one of the word lines 1206 (e.g., a respective transistor 1204 is a field effect transistor turned off or on by a signal from word line 1206 applied to its gate, which controls reading and writing and whether the cell is coupled to the complementary bit lines).

Each of the plurality of magnetoresistive random-access memory cells includes, as in FIG. 4 or FIG. 5, a templating layer including a binary alloy having an alternating layer lattice structure; a half metallic Heusler multilayer structure including a plurality of layers of two different Heusler compounds, at least one of which is half metallic, the half metallic Heusler multilayer structure being located outward of the templating layer and exhibiting perpendicular magnetic anisotropy (PMA); a tunnel barrier outward of the half metallic Heusler multilayer structure; and a magnetic layer outward of the tunnel barrier, all as described elsewhere herein. Typically, the capping layer 1215 or 1313 of devices indicated in FIG. 4 and FIG. 5 connect to the bit line 1210 while the layer 1203 or 1303 connect to bit line complement 1208 through the access FET.

The plurality of magnetoresistive random-access memory cells can include any one, some, or all of the features disclosed herein. For example, in some instances, the two different Heusler compounds are designated as "A" and "B"; the "A" Heusler compound is a half metallic Heusler compound is selected from the group consisting of $Mn_2FeSb$, $Mn_2CoSi$, $Mn_2MnAl$, $Co_2CrAl$, $Co_2CrGe$, $Co_2CrSi$, $Mn_2CoAl$, $Mn_2CuSi$, $Mn_2CoGe$, $Co_2MnSi$, $Co_2MnSb$, $Co_2MnGe$, $Mn_2CoAs$, $Mn_2FeAs$, $Fe_2MnSi$, and $Mn_2MnAs$; and the "B" Heusler compound is selected from the group consisting of $Mn_3Ge$, $Mn_3Al$, $Mn_2CoSi$, and $Mn_2CoAl$ (where, with the exception of $Mn_3Ge$, all are half metallic).

In one or more embodiments, the half metallic Heusler multilayer structure has at least one complete periodic substructure and no more than three periodic substructures, selected from the group consisting of 1×A/1×B, 2×A/1×B, 1×A/2×B, 2×A/2×B, 1×B/1×A, 2×B/1×A, 1×B/2×A, 2×B/2×A.

In one or more embodiments, the half metallic Heusler multilayer structure has a periodic substructure selected from the group consisting of: a single layer of $Co_2MnSi$ alternated with a single layer of $Mn_2MnGe$, a single layer of $Co_2MnSi$ alternated with a double layer of $Mn_2MnGe$, a single layer of $Co_2MnGe$ alternated with a single layer of $Mn_2MnGe$, a single layer of $Co_2MnGe$ alternated with a double layer of $Mn_2MnGe$, a single layer of $Mn_2CoAl$ alternated with a single layer of $Mn_2MnAl$, and a single layer of $Co_2MnSb$ alternated with a single layer of $Mn_2MnAl$.

The half metallic Heusler multilayer structure can be a storage layer and a reference layer, and the magnetic layer can be the other of the storage layer and the reference layer.

In still another aspect, an exemplary method of operation includes providing an array such as just described, applying signals to the word lines 1206 to cause a first subset of the cells 1202 to store logical ones and a second subset of the cells 1202 to store logical zeroes; and reading the stored logical ones and zeroes via the bit lines 1210 and the complementary bit lines 1208.

Figure 24:
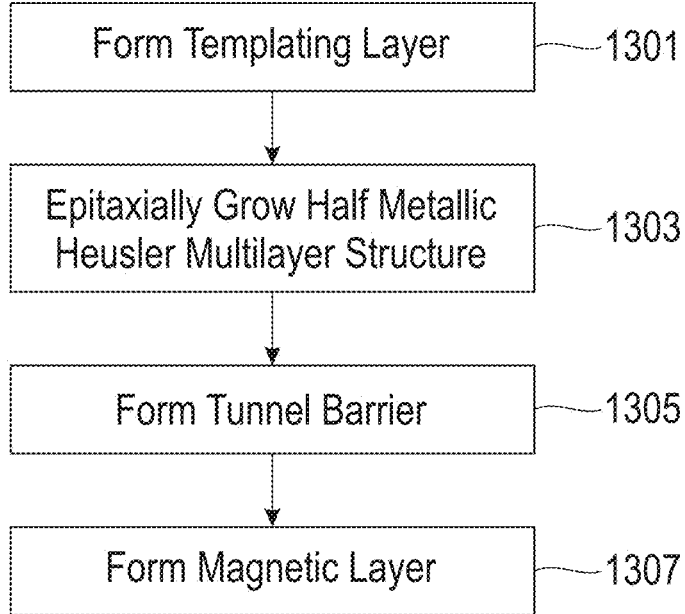
FIG. 24 shows a flow chart of a fabrication method, according to an aspect of the invention.

In yet another aspect, referring to FIG. 24, an exemplary method of forming a magnetoresistive random-access memory cell (such as in FIG. 4 or 5) includes, as per step 1301, providing a templating layer (e.g., part of 1203 or 1303, see layer 401 in FIG. 2). The templating layer includes a binary alloy having an alternating layer lattice structure. A further step includes epitaxially growing a half metallic Heusler multilayer structure (e.g., 1205 or 1305, see layer 403 in FIG. 2) on the templating layer. The half metallic Heusler multilayer structure includes a plurality of layers of two different Heusler compounds, at least one of which is half metallic. The two different half metallic Heusler compounds are designated as "A" and "B." The "A" Heusler compound is a half metallic Heusler compound is selected from the group consisting of $Mn_2FeSb$, $Mn_2CoSi$, $Mn_2MnAl$, $Co_2CrAl$, $Co_2CrGe$, $Co_2CrSi$, $Mn_2CoAl$, $Mn_2CuSi$, $Mn_2CoGe$, $Co_2MnSi$, $Co_2MnSb$, $Co_2MnGe$, $Mn_2CoAs$, $Mn_2FeAs$, $Fe_2MnSi$, and $Mn_2MnAs$. The "B" Heusler compound is selected from the group consisting of $Mn_3Ge$, $Mn_3Al$, $Mn_2CoSi$, and $Mn_2CoAl$ (where, with the exception of $Mn_3Ge$, all are half metallic). The half metallic Heusler multilayer structure is formed, for example, by epitaxially growing the innermost/lowest layer seen in FIGS. 7-22 is grown on the templating layer and then each successive layer is epitaxially grown on the preceding layer. Further steps include forming a tunnel barrier (e.g., 1209 or 1309, see layer 407 in FIG. 2) outward of the half metallic Heusler multilayer structure; and forming a magnetic layer

1211, 1311 outward of the tunnel barrier. The method can also include providing and/or forming other elements seen in FIGS. 4, 5, 27, and 28 using techniques apparent to the skilled artisan, given the teachings herein. The cells can be integrated into an array by forming a plurality of cells at the same time and interconnecting them with wires, transistors, and peripheral circuitry in a manner apparent to the skilled artisan, given the teachings herein.

In a further aspect, referring to FIGS. 27 and 28, a magnetoresistive random-access memory cell includes a magnetic layer 2705, 2805; a tunnel barrier 2709, 2809 outward of the magnetic layer; and a half metallic Heusler multilayer structure 2711, 2811 including a plurality of layers of two different Heusler compounds, at least one of which is half metallic. The half metallic Heusler multilayer structure is located outward of the tunnel barrier and exhibits perpendicular magnetic anisotropy (PMA).

As per FIG. 27, in some instances, the half metallic Heusler multilayer structure 2711 is a storage layer and the magnetic layer 2705 is a reference layer.

As per FIG. 28, in some instances, the half metallic Heusler multilayer structure 2811 is a reference layer and the magnetic layer 2805 is a storage layer.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from half metallic Heusler multilayer structures with perpendicular magnetic anisotropy (PMA) in MRAMs and the like.

An integrated circuit in accordance with aspects of the present inventions can be employed in essentially any application and/or electronic system where half metallic Heusler multilayer structures with perpendicular magnetic anisotropy (PMA) in MRAMs and the like would be beneficial. Given the teachings of the present disclosure provided herein, one of ordinary skill in the art will be able to contemplate other implementations and applications of embodiments disclosed herein.

In yet a further aspect, a hardware description language (HDL) design structure is encoded on a machine-readable data storage medium. The HDL design structure includes elements that when processed in a computer-aided design system generate a machine-executable representation of a magnetoresistive random-access memory cell and/or array, as described.

Figure 25:
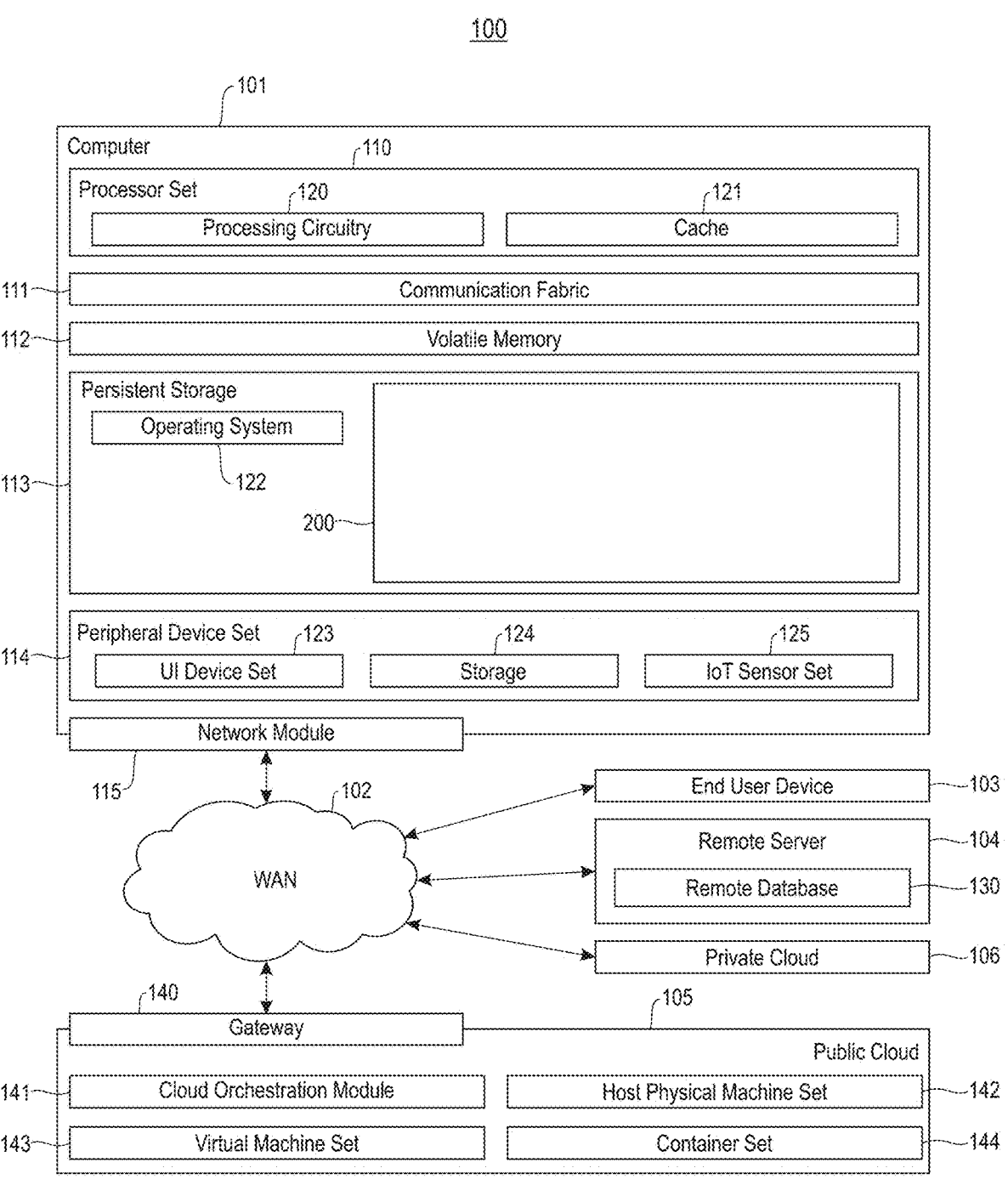
FIG. 25 depicts a computing environment according to an embodiment of the present invention (e.g., for implementing a design process such as that of FIG. 26)
Figure 26:
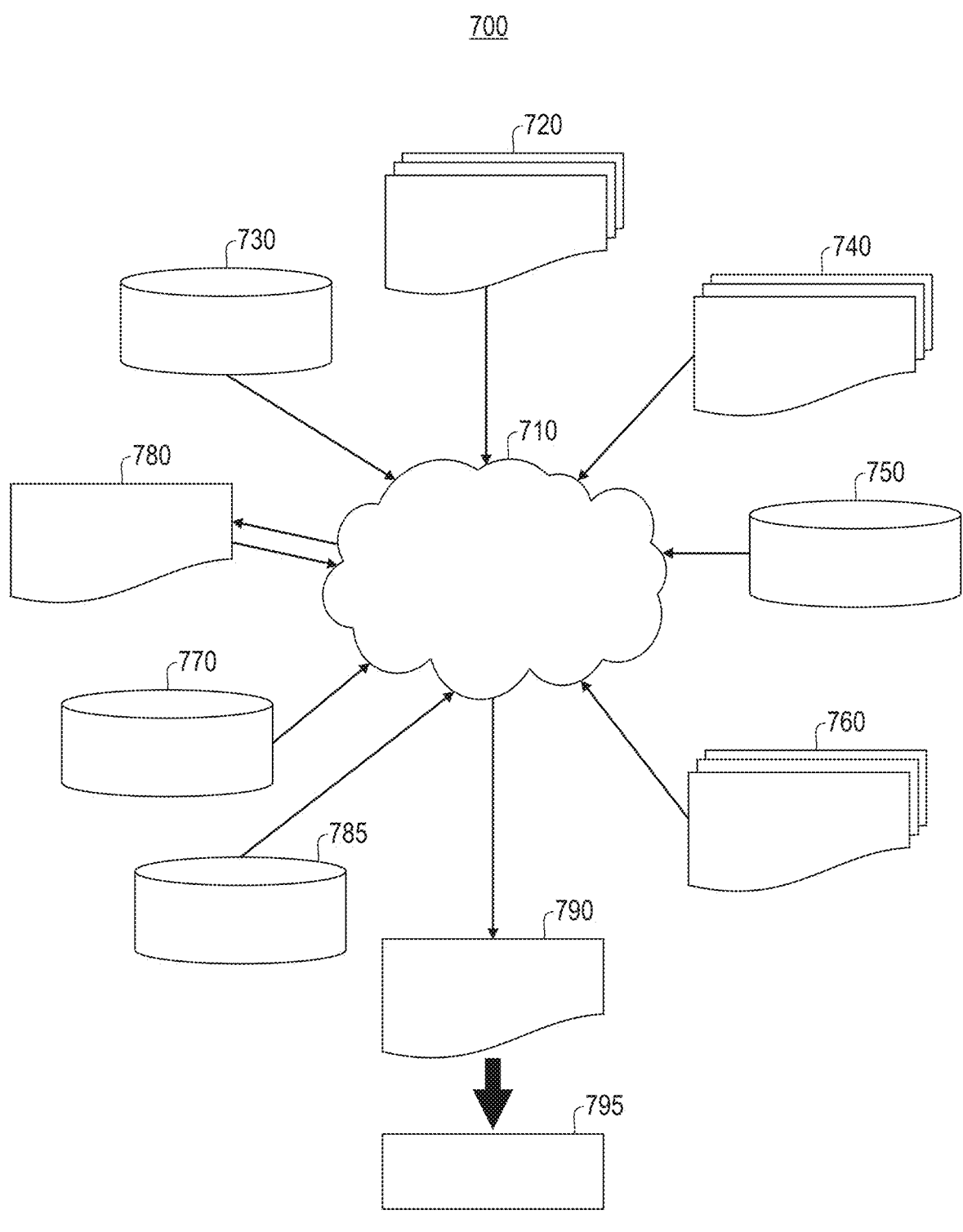
FIG. 26 is a flow diagram of a design process used in semiconductor design, manufacture, and/or test.

Reference should now be had to FIG. 25, which depicts a computing environment according to an embodiment of the present invention (e.g., for implementing a design process such as that of FIG. 26)

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as a system 200 for semiconductor design and/or control of semiconductor fabrication (see FIG. 26). In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Exemplary Design Process Used in Semiconductor Design, Manufacture, and/or Test

One or more embodiments make use of computer-aided semiconductor integrated circuit design simulation, test, layout, and/or manufacture. In this regard, FIG. 26 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 26 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer.

When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A magnetoresistive random-access memory cell, comprising:

a templating layer comprising a binary alloy having an alternating layer lattice structure;

a half metallic Heusler multilayer structure comprising a plurality of layers of two different Heusler compounds, at least one of which is half metallic, the half metallic Heusler multilayer structure being located outward of the templating layer and exhibiting perpendicular magnetic anisotropy (PMA);

a tunnel barrier outward of the half metallic Heusler multilayer structure; and a magnetic layer outward of the tunnel barrier.

2. The magnetoresistive random-access memory cell of claim 1, wherein:

the two different Heusler compounds are designated as "A" and "B";

the "A" Heusler compound is a half-metallic Heusler compound selected from the group consisting of $Mn_2FeSb$, $Mn_2CoSi$, $Mn_2MnAl$, $Co_2CrAl$, $Co_2CrGe$, $Co_2CrSi$, $Mn_2CoAl$, $Mn_2CuSi$, $Mn_2CoGe$, $Co_2MnSi$, $Co_2MnSb$, $Co_2MnGe$, $Mn_2CoAs$, $Mn_2FeAs$, $Fe_2MnSi$, and $Mn_2MnAs$; and the "B" Heusler compound is selected from the group consisting of $Mn_3Ge$, $Mn_3Al$, $Mn_2CoSi$, and $Mn_2CoAl$.

3. The magnetoresistive random-access memory cell of claim 2, wherein the half metallic Heusler multilayer structure has at least one complete periodic substructure and no more than three periodic substructures, selected from the group consisting of $1\times A/1\times B$, $2\times A/1\times B$, $1\times A/2\times B$, $2\times A/2\times B$, $1\times B/1\times A$, $2\times B/1\times A$, $1\times B/2\times A$, $2\times B/2\times A$.

4. The magnetoresistive random-access memory cell of claim 3, wherein the half metallic Heusler multilayer structure has a periodic substructure selected from the group consisting of:

a single layer of $Co_2MnSi$ alternated with a single layer of $Mn_2MnGe$, a single layer of $Co_2MnSi$ alternated with a double layer of $Mn_2MnGe$, a single layer of $Co_2MnGe$ alternated with a single layer of $Mn_2MnGe$, a single layer of $Co_2MnGe$ alternated with a double layer of $Mn_2MnGe$, a single layer of $Mn_2CoAl$ alternated with a single layer of $Mn_2MnAl$, and a single layer of $Co_2MnSb$ alternated with a single layer of $Mn_2MnAl$.

5. The magnetoresistive random-access memory cell of claim 4, wherein:

the half metallic Heusler multilayer structure has a periodic substructure selected from the group consisting of:

a single layer of $Co_2MnSi$ alternated with a single layer of $Mn_2MnGe$, a single layer of $Co_2MnSi$ alternated with a double layer of $Mn_2MnGe$, a single layer of $Co_2MnGe$ alternated with a single layer of $Mn_2MnGe$, a single layer of $Co_2MnGe$ alternated with a double layer of $Mn_2MnGe$, and a single layer of $Mn_2CoAl$ alternated with a single layer of $Mn_2MnAl$; and the templating layer comprises CoAl.

6. The magnetoresistive random-access memory cell of claim 4, wherein:

the half metallic Heusler multilayer structure has a periodic substructure comprising a single layer of $Co_2MnSb$ alternated with a single layer of $Mn_2MnAl$; and the templating layer is selected from the group consisting of RuAl, FeAl, and RuSi.

7. The magnetoresistive random-access memory cell of claim 4, wherein each single layer has a thickness of $1\pm0.1$ unit cell and each double layer has a thickness of $2\pm0.2$ unit cells.

8. The magnetoresistive random-access memory cell of claim 3, wherein:

the half metallic Heusler multilayer structure comprises a storage layer; and the magnetic layer comprises a reference layer.

9. The magnetoresistive random-access memory cell of claim 8, wherein the tunnel barrier is selected from the group consisting of magnesium oxide and magnesium aluminum oxide.

10. The magnetoresistive random-access memory cell of claim 8, wherein the binary alloy is represented by $A_{1-x}E_x$, wherein A is a transition metal element and E is a main group element including at least one of aluminum and gallium, and x is in the range from 0.42 to 0.55.

11. The magnetoresistive random-access memory cell of claim 3, wherein:

the half metallic Heusler multilayer structure comprises a reference layer; and the magnetic layer comprises a storage layer.

12. The magnetoresistive random-access memory cell of claim 1, wherein the alternating layer lattice structure of the templating layer comprises a cesium chloride structure.

13. The magnetoresistive random-access memory cell of claim 1, wherein the templating layer is nonmagnetic at room temperature.

14. The magnetoresistive random-access memory cell of claim 1, wherein:

the half metallic Heusler multilayer structure has a calculated half metallic Heusler multilayer structure in-plane lattice constant determined from energy minimization calculations; and the templating layer has a templating layer in-plane lattice constant that matches the calculated half metallic Heusler multilayer structure in-plane lattice constant determined from energy minimization calculations within plus or minus 2%.

15. A magnetoresistive random-access memory array, comprising:

a plurality of bit lines and a plurality of complementary bit lines forming a plurality of bit line-complementary bit line pairs;

a plurality of word lines intersecting the plurality of bit line pairs at a plurality of cell locations; and a plurality of magnetoresistive random-access memory cells located at each of the plurality of cell locations, each of the magnetoresistive random-access memory cells being electrically connected to a corresponding bit line and selectively interconnected to a corresponding one of the complementary bit lines under control of a corresponding one of the word lines, each of the plurality of magnetoresistive random-access memory cells comprising:

a templating layer comprising a binary alloy having an alternating layer lattice structure;

a half metallic Heusler multilayer structure comprising a plurality of layers of two different Heusler compounds, at least one of which is half metallic, the half metallic Heusler multilayer structure being located outward of the templating layer and exhibiting perpendicular magnetic anisotropy (PMA);

a tunnel barrier outward of the half metallic Heusler multilayer structure; and a magnetic layer outward of the tunnel barrier.

16. The magnetoresistive random-access memory array of claim 15, wherein:

the two different Heusler compounds are designated as "A" and "B";

the "A" Heusler compound is a half metallic Heusler compound selected from the group consisting of $Mn_2FeSb$, $Mn_2CoSi$, $Mn_2MnAl$, $Co_2CrAl$, $Co_2CrGe$, $Co_2CrSi$, $Mn_2CoAl$, $Mn_2CuSi$, $Mn_2CoGe$, $Co_2MnSi$, $Co_2MnSb$, $Co_2MnGe$, $Mn_2CoAs$, $Mn_2FeAs$, $Fe_2MnSi$, and $Mn_2MnAs$; and the "B" Heusler compound is selected from the group consisting of $Mn_3Ge$, $Mn_3Al$, $Mn_2CoSi$, and $Mn_2CoAl$.

17. The magnetoresistive random-access memory array of claim 16, wherein the half metallic Heusler multilayer structure has at least one complete periodic substructure and no more than three periodic substructures, selected from the group consisting of $1\times A/1\times B$, $2\times A/1\times B$, $1\times A/2\times B$, $2\times A/2\times B$, $1\times B/1\times A$, $2\times B/1\times A$, $1\times B/2\times A$, $2\times B/2\times A$.

18. The magnetoresistive random-access memory array of claim 17, wherein the half metallic Heusler multilayer structure has a periodic substructure selected from the group consisting of:

a single layer of $Co_2MnSi$ alternated with a single layer of $Mn_2MnGe$, a single layer of $Co_2MnSi$ alternated with a double layer of $Mn_2MnGe$, a single layer of $Co_2MnGe$ alternated with a single layer of $Mn_2MnGe$, a single layer of $Co_2MnGe$ alternated with a double layer of $Mn_2MnGe$, a single layer of $Mn_2CoAl$ alternated with a single layer of $Mn_2MnAl$, and a single layer of $Co_2MnSb$ alternated with a single layer of $Mn_2MnAl$.

19. The magnetoresistive random-access memory array of claim 15, wherein:

the half metallic Heusler multilayer structure comprises one of a storage layer and a reference layer; and the magnetic layer comprises another of the storage layer and the reference layer.

20. A magnetoresistive random-access memory cell, comprising:

a magnetic layer;

a tunnel barrier outward of the magnetic layer;

a half metallic Heusler multilayer structure comprising a plurality of layers of two different Heusler compounds, at least one of which is half metallic, the half metallic Heusler multilayer structure being located outward of the tunnel barrier and exhibiting perpendicular magnetic anisotropy (PMA), wherein:

the two different Heusler compounds are designated as "A" and "B";

the half metallic Heusler multilayer structure has at least one complete periodic substructure and no more than three periodic substructures, selected from the group consisting of $1\times A/1\times B$, $2\times A/1\times B$, $1\times A/2\times B$, $2\times A/2\times B$, $1\times B/1\times A$, $2\times B/1\times A$, $1\times B/2\times A$, $2\times B/2\times A$; and each single layer has a thickness of $1\pm0.1$ unit cell and each double layer has a thickness of $2\pm0.2$ unit cells.

21. The magnetoresistive random-access memory cell of claim 20, wherein:

the "A" Heusler compound is a half-metallic Heusler compound selected from the group consisting of $Mn_2FeSb$, $Mn_2CoSi$, $Mn_2MnAl$, $Co_2CrAl$, $Co_2CrGe$, $Co_2CrSi$, $Mn_2CoAl$, $Mn_2CuSi$, $Mn_2CoGe$, $Co_2MnSi$, $Co_2MnSb$, $Co_2MnGe$, $Mn_2CoAs$, $Mn_2FeAs$, $Fe_2MnSi$, and $Mn_2MnAs$; and the "B" Heusler compound is selected from the group consisting of $Mn_3Ge$, $Mn_3Al$, $Mn_2CoSi$, and $Mn_2CoAl$.

* * * * *